(12) United States Patent
Teshirogi et al.

(10) Patent No.: US 8,525,744 B2
(45) Date of Patent: Sep. 3, 2013

(54) RADIATED POWER MEASUREMENT METHOD, RADIATED POWER MEASUREMENT COUPLER AND RADIATED POWER MEASUREMENT APPARATUS

(75) Inventors: Tasuku Teshirogi, Atsugi (JP); Aya Hinotani, Atsugi (JP); Takashi Kawamura, Atsugi (JP); Toru Sakuma, Atsugi (JP)

(73) Assignee: Anritsu Corporation, Atsugi-shi (JP)

(*) Notice: Subject to any disclaimer, the term of this patent is extended or adjusted under 35 U.S.C. 154(b) by 393 days.

(21) Appl. No.: 12/917,735

(22) Filed: Nov. 2, 2010

(65) Prior Publication Data

US 2011/0043418 A1 Feb. 24, 2011

Related U.S. Application Data

(63) Continuation of application No. PCT/JP2009/058699, filed on May 8, 2009.

(30) Foreign Application Priority Data

May 9, 2008 (JP) .................................. 2008-123670

(51) Int. Cl.
*G01R 29/10* (2006.01)

(52) U.S. Cl.
USPC ........................................................ 343/703

(58) Field of Classification Search
USPC .................................... 343/703, 853; 702/76
See application file for complete search history.

(56) References Cited

U.S. PATENT DOCUMENTS

| | | | | |
|---|---|---|---|---|
| 4,931,798 | A | * | 6/1990 | Kogo ................................. 342/4 |
| 5,432,523 | A | * | 7/1995 | Simmers et al. ............... 343/703 |
| 2004/0183574 | A1 | | 9/2004 | Levin et al. |

FOREIGN PATENT DOCUMENTS

| | | |
|---|---|---|
| JP | 1-280398 | 11/1989 |
| JP | 2000-324063 | 11/2000 |
| JP | 3436669 | 6/2003 |
| JP | 2003-529983 | 10/2003 |
| JP | 2006-322921 | 11/2006 |

OTHER PUBLICATIONS

J.H. Cook, Jr. et al. "Antenna Pattern Measurements," Microwave Antenna Measurements. Published 1985.*
International Search Report issued in Int'l. App. No. PCT/JP2009/058699, mailed Jul. 28, 2009.
Teshirogi et al.; "Total Radiated Power (TRP) Measurement of Small Radio Terminals Using a Spheroidal Coupler," IEICE Technical Report, Mar. 13, 2008; vol. 107, No. 543, pp. 113-118.
Nojima et al.; Simplified High Accuracy Measuring Method for Radio Equipment Using Integral Antennas-Radiated RF Power Measurement Using a Spherical Positioner (Part 1); Technical Report of IEICE; Jul. 2002; pp. 29-34.
Nojima et al.; Simplified High Accuracy Measuring Method for Radio Equipment Using Integral Antennas-Radiated RF Power Measurement Using a Spherical Positioner (Part 2); Technical Report of IEICE; Jul. 2003; pp. 125-130.

* cited by examiner

*Primary Examiner* — Huedung Mancuso
(74) *Attorney, Agent, or Firm* — Greer, Burns & Crain, Ltd.

(57) ABSTRACT

In a method of measuring a radiation power generated from a DUT from an output of a measurement antenna, wherein the DUT is arranged in an ellipsoid enclosed space such that a radiation center of the radio wave is substantially coincided with the neighborhood of a first focal point. The radio wave radiated from the DUT and reflected from the wall surface is received by a receiving antenna arranged in the neighborhood a second focal point thereby to measure the total radiated power of the DUT from the output signal of the receiving antenna. One of the DUT and the receiving antenna is moved along the axis passing through the first and second focal points, and based on the measurement value maximizing the output signal power of the receiving antenna, calculating the total radiated power of the DUT.

17 Claims, 20 Drawing Sheets

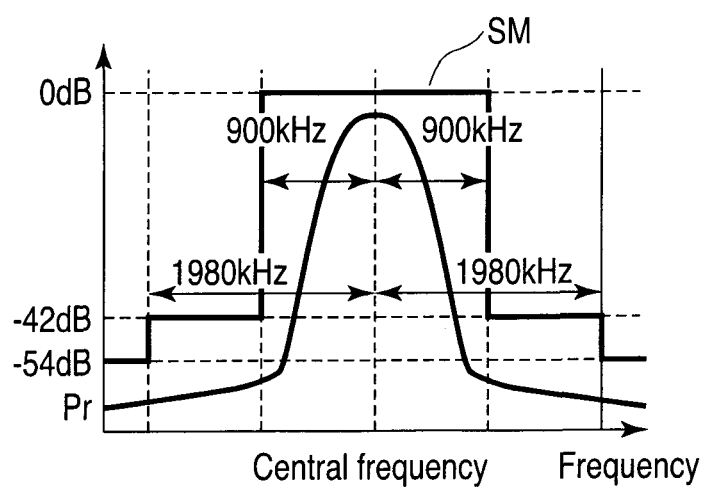
F I G. 7

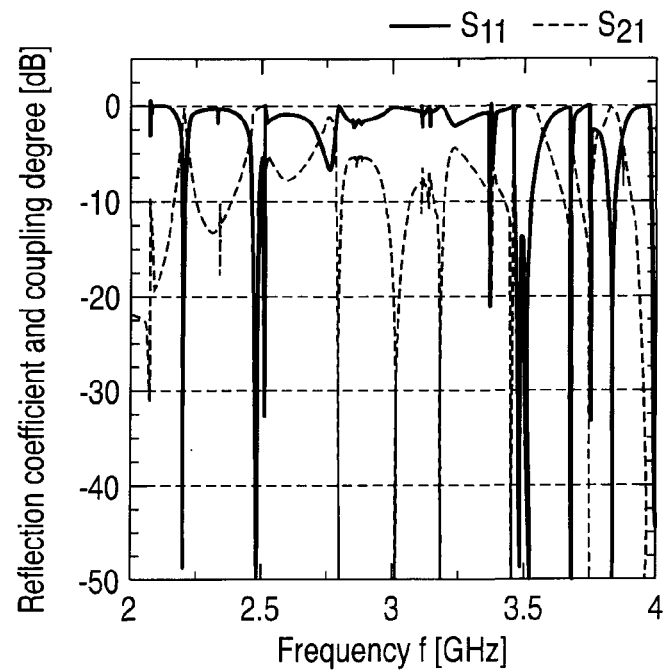
F I G. 9
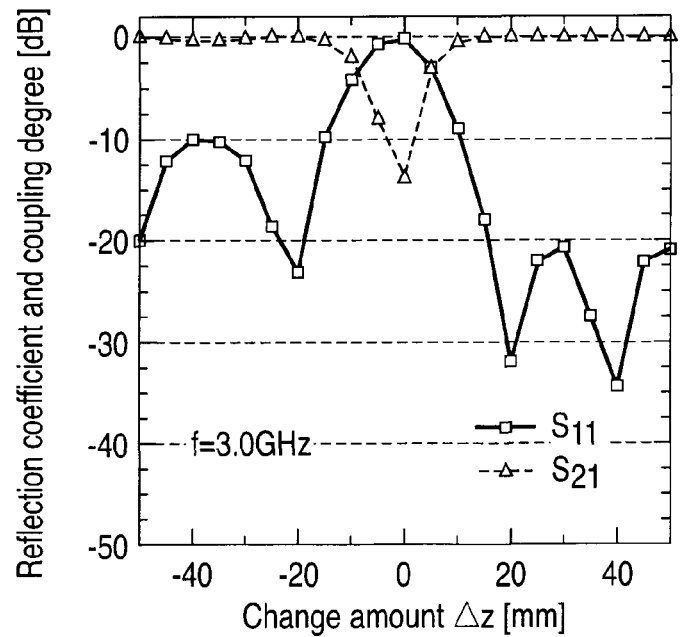
F I G. 10

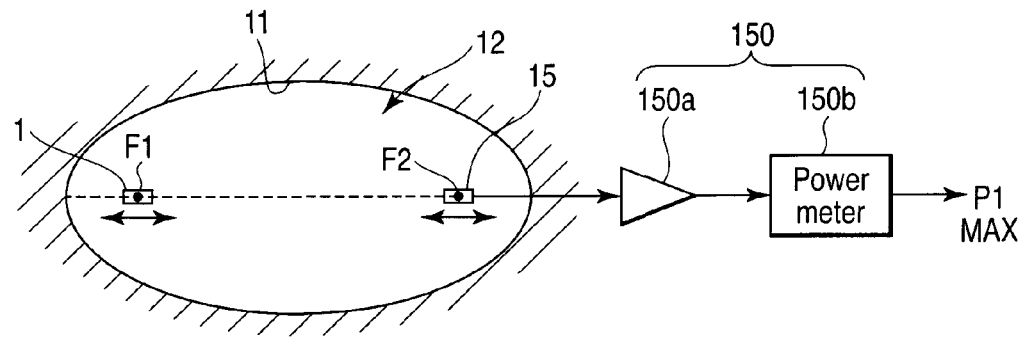
F I G. 14A
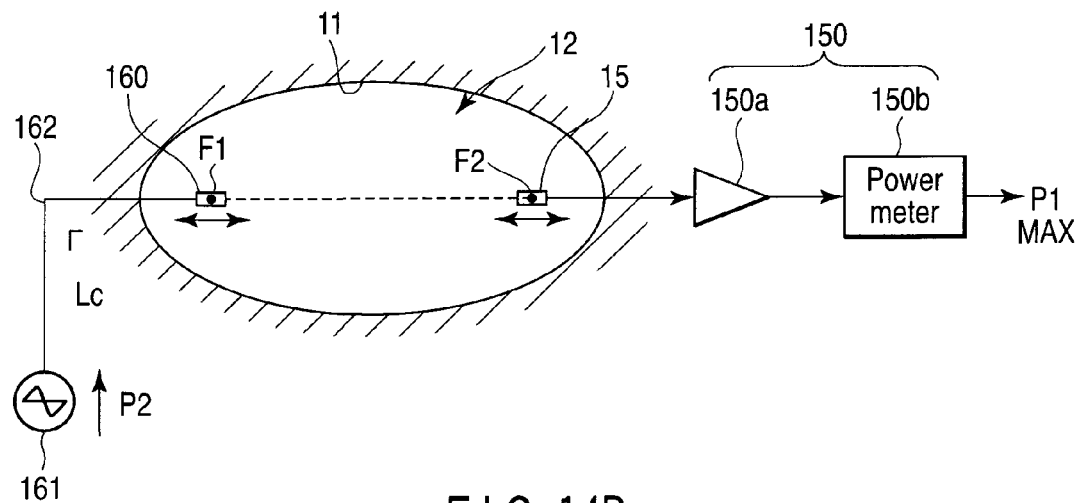
F I G. 14B

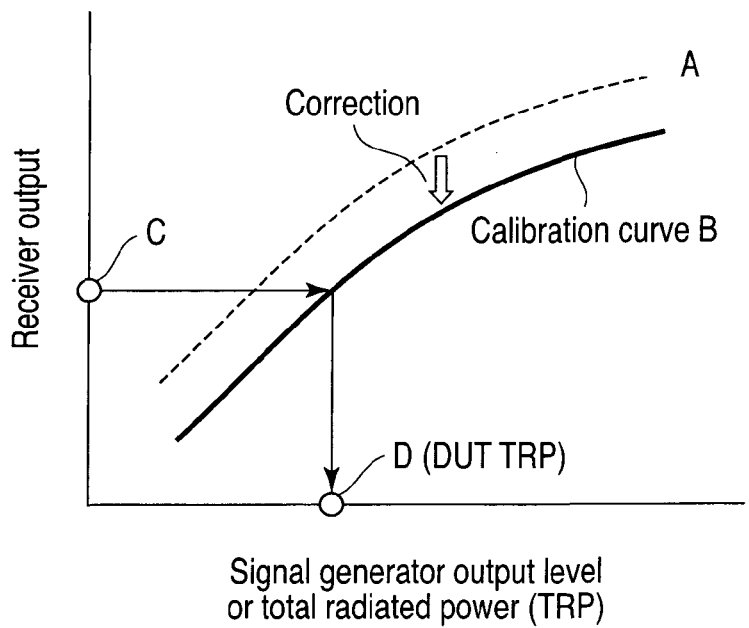
F I G. 16
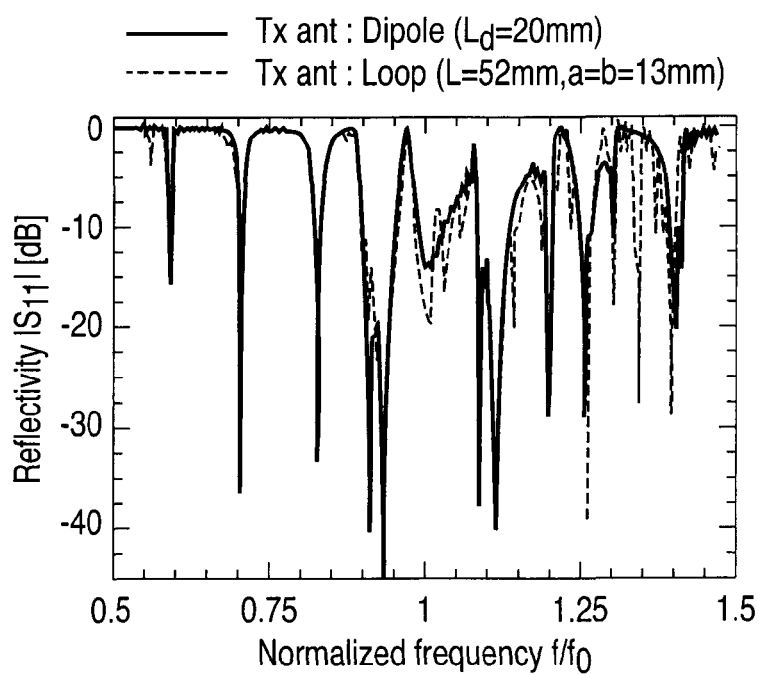
F I G. 17

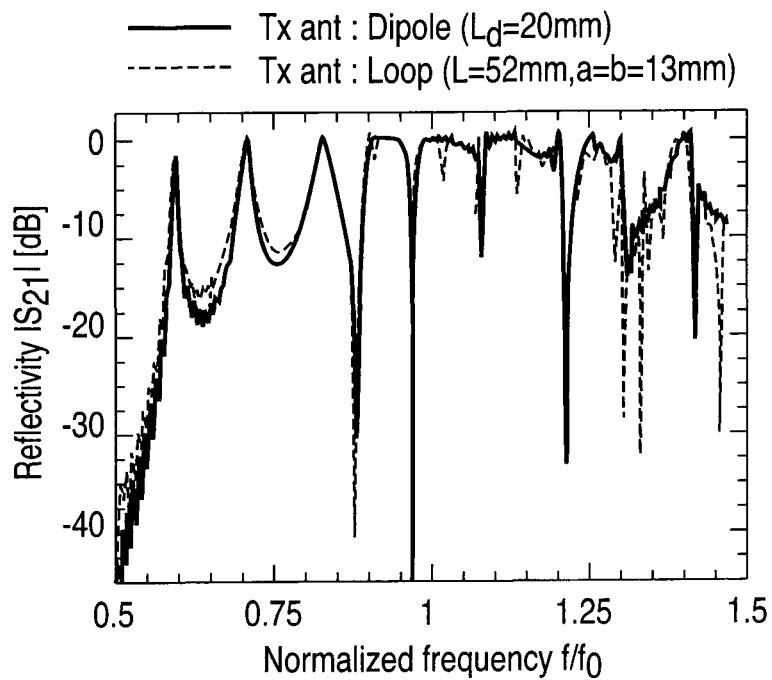
F I G. 18
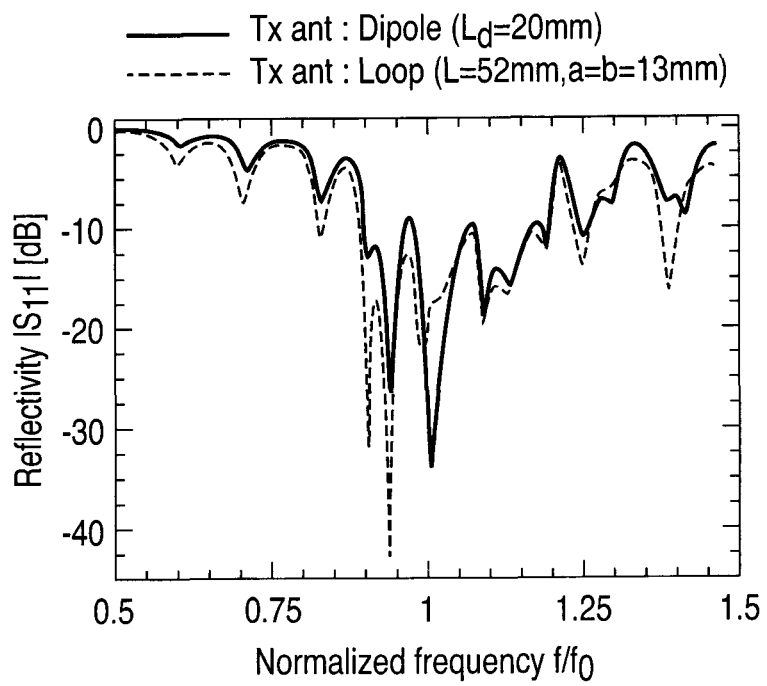
F I G. 19

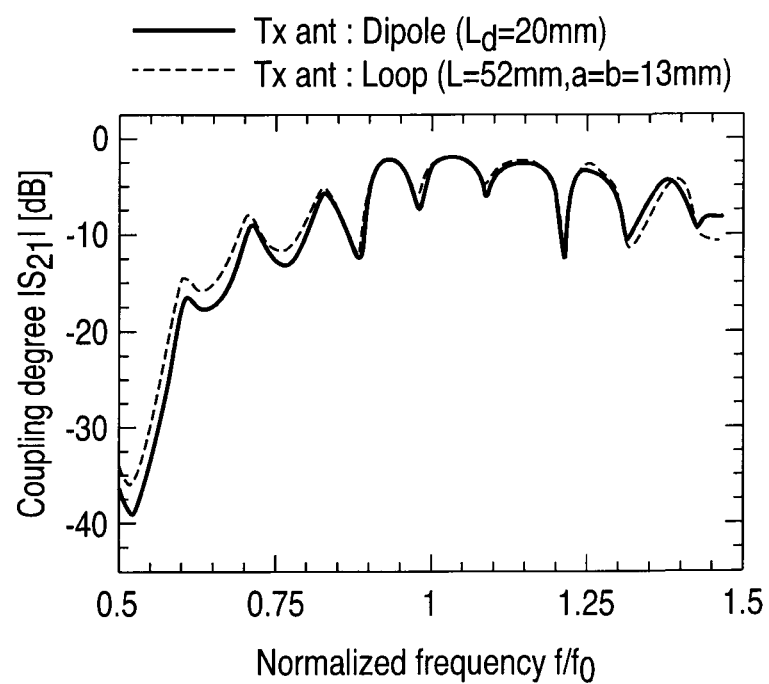
F I G. 20

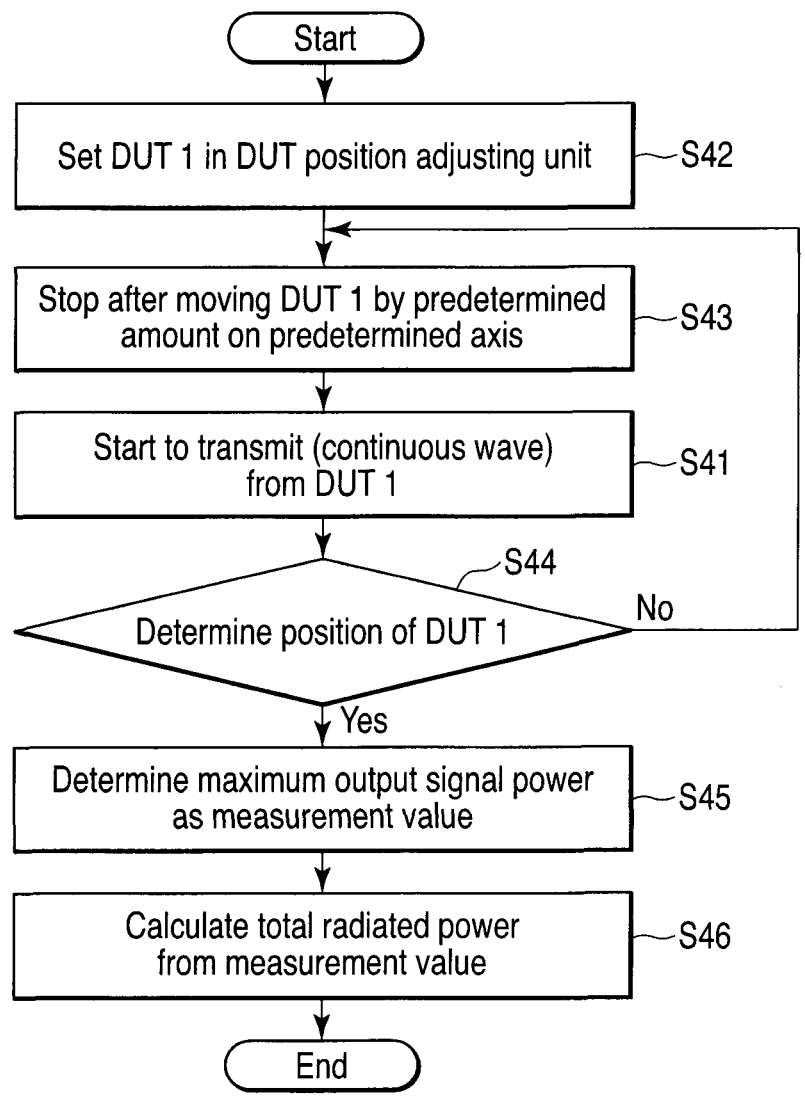
F I G. 22

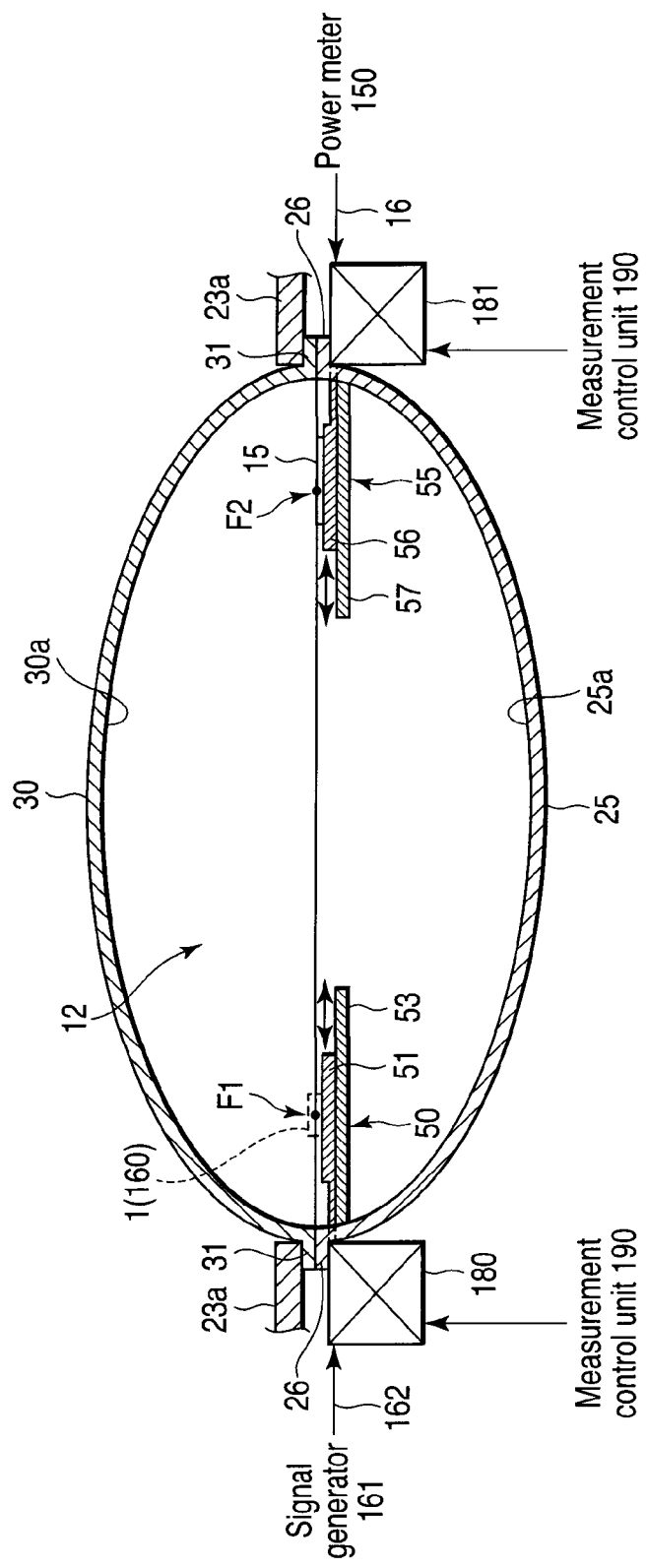
F I G. 24

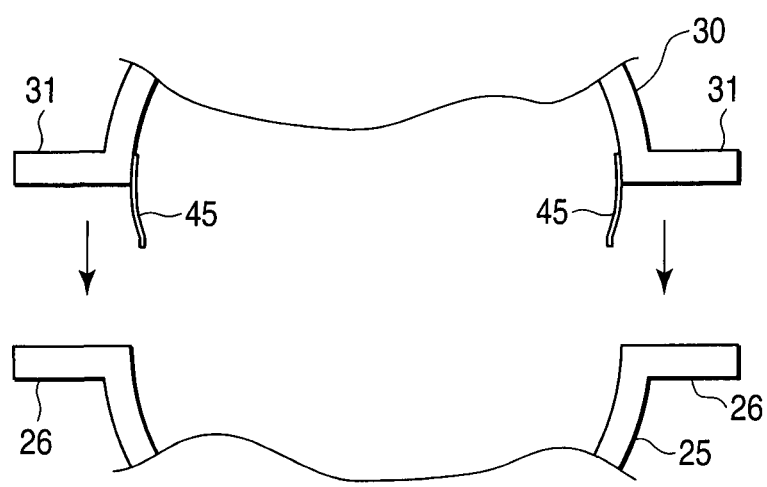
F I G. 25A
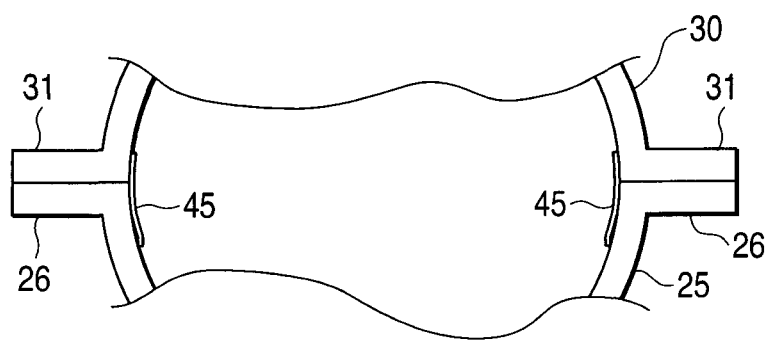
F I G. 25B

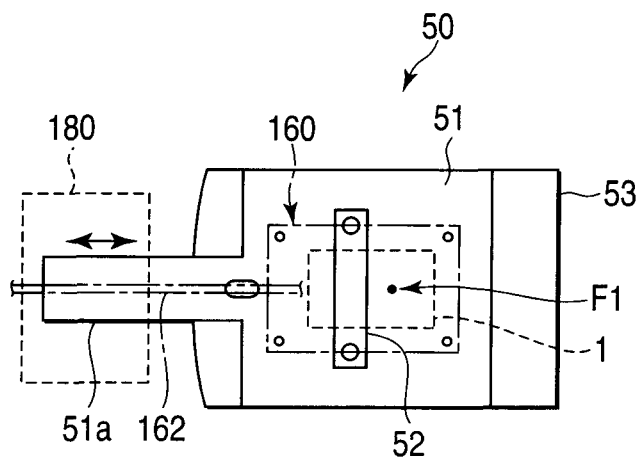
F I G. 26A
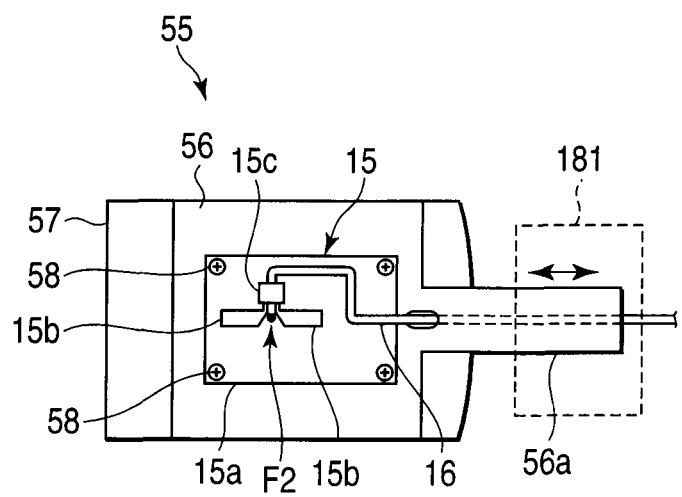
F I G. 26B

RADIATED POWER MEASUREMENT METHOD, RADIATED POWER MEASUREMENT COUPLER AND RADIATED POWER MEASUREMENT APPARATUS

CROSS REFERENCE TO RELATED APPLICATIONS

This is a Continuation Application of PCT Application No. PCT/JP2009/058699, filed May 8, 2009, which was published under PCT Article 21(2) in Japanese.

This application is based upon and claims the benefit of priority from prior Japanese Patent Application No. 2008-123670, filed May 9, 2008, the entire contents of which are incorporated herein by reference.

BACKGROUND OF THE INVENTION

1. Field of the Invention

The present invention relates to a method capable of measuring the radiated power with a simple configuration and a small radio terminal in a short time with a high sensitivity, a coupler configured to measure the radiated power and an apparatus configured to measure the radiated power.

2. Description of the Related Art

With the arrival of the ubiquitous society, an explosive extension of ownership of and an increased demand for an ultra small radio terminal such as radio communication devices in terms of the radio frequency identification tag (RFID), the ultra wide band (UWB) and the body area network (BAN) are expected.

Many of these devices, unlike the conventional radio communication devices, have no test terminal due to the dimensional limitation or the economic reason. Any of these devices is required to be tested, therefore, by receiving the radio wave radiated by the particular device itself. Especially, the radiated power of the small radio terminals described above is strictly specified taking the effect thereof on the other communications and the human bodies into consideration. Thus, the measurement of the radiated power constitutes an important test item.

The radiated power includes the equivalent isotropically radiated power or the effective isotropically radiated power (EIRP) and the total radiated power (TRP) with the power radiated into the whole space. In measuring the radiated power, TRP has come to be used in more and more cases in view of the fact that EIRP requires a complicated measuring instrument and a long measurement time.

The well-known conventional TRP measurement methods so far used include the following:

(1) The spherical scanning method in which such points on a spherical surface that contain a device under test (DUT) are scanned with a probe, and by measuring and accumulating the radiated power at mesh points, the total radiated power is then determined.

(2) The method in which the radio wave radiated from a device under test (DUT) is agitated by the rotation of a metal blade thereby to generate a random field in a room covered with a metal, and the total radiated power (TRP) from the DUT is estimated based on a statistical technique.

(3) The method using a pyramidal space covered with a metal film and a device called a G-TEM cell (gigahertz transverse electromagnetic cell) which generates the TEM wave in a radio wave absorber.

(4) The method using an electromagnetic coupling device having a plurality of antennas, an isolator connected to each of the antennas, a phase regulator, a synthesizer configured to synthesize the signals of the array antennas, and the like to measure the radiated power from a device under test (DUT) arranged on the center line of the antenna array.

Incidentally, the spherical surface scanning method of (1) is disclosed in TECHNICAL REPORT OF IEICE AP2002-61 (2002-7), pp. 29-34, July 2002 "Simplified High Accuracy Measuring Method for Radio Equipment Using Integral Antennas, Radiated RF Power Measurement Using a Spherical Positioner (Part 1)", Tomoyuki NOJIMA, Kyoichi NAKAJIMA, TECHNICAL REPORT OF IEICE AP2003-85, pp. 125-130, July 2003 "Simplified High Accuracy Measuring Method for Radio Equipment Using Integral Antennas, Radiated RF Power Measurement Using a Spherical Positioner (Part 2)", Tomoyuki NOJIMA, Kyoichi NAKAJIMA and the electromagnetic wave coupling device of (4) in Japanese Patent No. 3436669.

A highly accurate measurement is possible by the spherical surface scanning method disclosed in TECHNICAL REPORT OF IEICE AP2002-61 (2002-7), pp. 29-34, July 2002 "Simplified High Accuracy Measuring Method for Radio Equipment Using Integral Antennas, Radiated RF Power Measurement Using a Spherical Positioner (Part 1)", Tomoyuki NOJIMA, Kyoichi NAKAJIMA, and TECHNICAL REPORT OF IEICE AP2003-85, pp. 125-130, July 2003 "Simplified High Accuracy Measuring Method for Radio Equipment Using Integral Antennas, Radiated RF Power Measurement Using a Spherical Positioner (Part 2)", Tomoyuki NOJIMA, Kyoichi NAKAJIMA. On the other hand, large equipment including a radio wave non-reflection chamber and a spherical surface scanner is required, and it takes a long time to measure.

Further, according to the spherical surface scanning method, radio waves are radiated to only a small part of the whole space and the power is determined from the total sum thereof. Therefore, the receiving sensitivity at each measurement point is so small that the problem is posed that the measurement of spurious radiation is difficult. In a UWB device, for example, the continuous spurious radiation is defined as −90 dBm/MHz and the impulsive spurious radiation as −84 dBm/MHz. It is very difficult to measure these spurious radiations by the measurement method described above.

The method in which the radio wave is agitated in a room covered with a metal, on the other hand, has the advantage that a large radio wave non-reflection chamber is not required. The problems of this method, however, are that the coincidence between the artificially generated random field and the theoretical probability model remains ambiguous, the statistical process on which the method is based makes a large inaccurate result, the measurement requires a long time, and the like. Another problem of this method is that, like in the spherical surface scanning method, the spurious radiation cannot be measured easily.

Also, the method using the G-TEM cell poses the problem that not only it is difficult to secure the uniformity of the internal field distribution but also the measurement of the total radiated power makes it necessary to arrange a two-axis rotary table in the G-TEM cell to make it possible to move the DUT in all directions.

Further, the method described in Japanese Patent No. 436669 requires a plurality of antennas, an isolator connected to each of the antennas, a phase regulator, a synthesizer configured to synthesize the signals of the array antennas, and the like. This poses, therefore, the problem that not only the system is complicated and high in cost but also the DUT is limited to the dipole antenna. Also, the measurement of the spurious radiation is difficult as in each of the aforementioned methods.

As a technique for solving these problems, the present inventors have already proposed a method to measure the total radiated power of the antenna using a spheroidal coupler disclosed in IEICE Technical Report AP2007-192 (2008-03), pp. 113-118 "Total radiated power (TRP) measurement of small radio terminals using a spheroidal coupler".

In the method disclosed in this document, an enclosed space surrounded by an ellipsoidal metal wall surface obtained by rotating an ellipse around an axis connecting the focal points of the ellipse is formed, and at the focal points of the enclosed space of the ellipsoid, a DUT and a receiving antenna are arranged, respectively, so that the radio wave radiated from the DUT is reflected on the wall surface and concentrated at the receiving antenna thereby to measure the total radiated power of the DUT.

The method disclosed in the IEICE Technical Report AP2007-192 (2008-03), pp. 113-118 "Total radiated power (TRP) measurement of small radio terminals using a spheroidal coupler" is based on the principle that the radio waves output in various directions from a position in the neighborhood of the first focal point are reflected on the wall surface and concentrated in the neighborhood of the second focal point substantially at the same time. According to this method, only the primary reflection wave is extracted to measure the total radiated power in order to remove the effect of what is called the multiple reflection is avoided in which the radio wave passed through the neighborhood of the second focal point is reflected again on the wall surface and returned to the neighborhood of the first focal point, and after being reflected again on the wall surface, returns to the second focal point.

According to this method, the total radiated power can be measured without any problem as long as the DUT is small and the radiation characteristic thereof has no directivity. It has been found, however, in the case where the DUT is large in size and the beam radiated from the DUT is divided into a plurality of components or the radio wave output from the DUT has a side lobe, a cancellation phenomenon occurs in which the beams of different phases are concentrated in the neighborhood of the focal points to weaken the radio wave, thereby making it difficult to measure the total radiated power accurately.

BRIEF SUMMARY OF THE INVENTION

An object of the invention is to provide a radiated power measurement method, a radiated power measurement coupler and a radiated power measurement apparatus capable of measuring the total radiated power accurately free of the effects of the size or directivity of the DUT.

Incidentally, a concept or concepts of the invention is based on the knowledge that the coupling degree between the DUT and the receiving antenna is increased and a more desirable result can be obtained by measuring the whole power including the multiple reflection components radiated from the DUT. Specifically, the interior of the enclosed space of the ellipsoidal coupler is basically regarded free of loss, and therefore, as long as the input reflection coefficient of a radiator such as the DUT or a reference antenna replacing the DUT is sufficiently small, the entire power radiated from the particular radiator should be retrieved as a load on the receiving antenna. In other words, an ideal coupler having the coupling degree of unity should be able to be obtained. This fact is established regardless of the size or directivity of the radiator.

The reflection coefficient of the antenna of the radiator in the coupler is subject to a considerable change downward or upward with the frequency due to the effect of the multiple reflections. By changing the positions of the radiator and the receiving antenna along the axis of the ellipse, however, the phase of the multiple reflection wave changes and the position where the reflection coefficient of the transmission antenna is minimum can be found. At this position, the power of the signal output of the receiving antenna becomes maximum, and corresponds to the total radiated power of the radiator. The invention is based on the consideration of this point.

In order to achieve the object described above, according to a first aspect of the invention, there is provided a radiated power measurement method comprising the steps of:

radiated power measurement method comprising the steps of:

arranging a device under test capable of radiating a radio wave in an enclosed space having first and second focal points, in such a manner that the radiation center of the radio wave of the device under test substantially coincides with the neighborhood of the first focal point, wherein the enclosed space is defined by a metal wall surface of an ellipsoid obtained by rotating an ellipse around an axis passing through the first focal point and the second focal point; and reflecting the radio wave radiated from the device under test, on the wall surface, and receiving the radio wave by a receiving antenna arranged in the neighborhood the second focal point thereby to measure, at the measuring end of the receiving antenna, the total radiated power of the device under test from the output signal of the receiving antenna, wherein at least one of the device under test and the receiving antenna is moved along the axis passing through the first and second focal points, and based on the measurement value maximizing the output signal power of the receiving antenna, calculating the total radiated power of the device under test.

According to a second aspect of the invention based on the first aspect, there is provided a radiated power measurement method comprising the steps of:

moving at least one of the DUT and the receiving antenna along the axis passing through the first and second focal points, and by maximizing the output signal power of the receiving antenna, storing the maximum output signal power as a first measurement value;

moving at least one of a reference antenna installed in place of the DUT to receive a signal and radiate the radio wave and the receiving antenna, along the axis passing through the first and second focal points, maximizing the output signal power of the receiving antenna, and determining, as a second measurement value, the signal power input to the reference antenna in the case where the maximum value is equal to the first measurement value; and calculating the total radiated power of the DUT based on the first measurement value, the second measurement value, and the reflection coefficient and the loss of the reference antenna.

According to a third aspect of the invention based on the first aspect, there is provided a radiated power measurement method comprising the steps of:

moving at least one of the DUT and the receiving antenna along the axis passing through the first and second focal points, and by maximizing the output signal power of the receiving antenna, storing the maximum output signal power of the receiving antenna as a first measurement value;

moving at least one of a reference antenna installed in place of the DUT to receive a signal and radiate the radio wave and the receiving antenna, along the axis passing through the first and second focal points, changing the signal power supplied to the reference antenna with the output signal power of the receiving antenna maximized;

determining the calibration data indicating the relation between the signal power and the corresponding output signal power of the receiving antenna; and calculating the total radiated power of the DUT based on the first measurement value, the calibration data and the reflection coefficient and the loss of the reference antenna.

According to a fourth aspect of the invention based on the first aspect, there is provided a radiated power measurement method comprising the steps of:

moving at least one of the DUT and the receiving antenna along the axis passing through the first and second focal points, and by determining the power for each frequency in a predetermined frequency range to be measured with respect to the output signal of the receiving antenna for each position of the antenna, storing the maximum power for each frequency as a third measurement value;

moving at least one of a reference antenna installed in place of the DUT and supplied with a signal to radiate the radio wave and the receiving antenna, along the axis passing through the first and second focal points, and by determining the power for each frequency to be measured with respect to the output signal of the receiving antenna for each position of the antenna, storing the data including the maximum power for each frequency as a fourth measurement value; and calculating the total radiated power in the predetermined frequency range of the DUT to be measured, based on the third measurement value, the fourth measurement value and the reflection coefficient and the loss of the reference antenna.

According to a fifth aspect of the invention based on the fourth aspect, there is provided a radiated power measurement method, wherein in the case where the reference antenna is used in place of the DUT, the calibration data indicating the relation between the signal power supplied to the reference antenna and the power of the corresponding output signal of the receiving antenna is determined as the fourth measurement value.

According to a sixth aspect of the invention based on any one of first to fifth aspects, there is provided a radiated power measurement wherein selected one of the DUT and the reference antenna is moved together with the receiving antenna symmetrically with respect to each other about the center of the focal points.

According to a seventh aspect of the invention based on the fourth aspect, there is provided a radiated power measurement method further comprising the steps of:

storing a spectrum mask of a predetermined standard including a frequency and an output strength; and determining whether the standard is satisfied or not, by comparing the spectrum mask with the value of the total radiated power of the radio wave for each frequency within a predetermined frequency range to be measured.

According to a eighth aspect of the invention based on the fourth aspect, there is provided a radiated power measurement method comprising the steps of:

adjusting the position of at least one of the DUT and the receiving antenna along at least one of X, Y and Z axes;

storing the third measurement value each time the position of at least one of the DUT and the receiving antenna is adjusted along at least one of the X, Y and Z axes;

adjusting the position of at least one of a reference antenna installed in place of the DUT and supplied with a signal to radiate the radio wave and the receiving antenna, along at least one of the X, Y and Z axes;

storing the fourth measurement value each time the position of at least one of the reference antenna and the receiving antenna is adjusted along at least one of the X, Y and Z axes; and calculating the total radiated power of the DUT in the predetermined frequency range to be measured, based on the third measurement value, the fourth measurement value and the reflection coefficient and the loss of the reference antenna.

According to a ninth aspect, there is provided a radiated power measurement coupler configured to measure a radiated power, and comprising a radiator which radiates a radio wave and a receiving antenna which receives the radio wave radiated from the radiator, wherein the radiator includes one of a device under test and a reference antenna, the radiator and the receiving antenna are supported in an enclosed space defined by a metal wall surface, the receiving antenna receives the radio wave radiated from the radiator to output the receiving signal, and the coupler further comprises:

a radiator support unit with the enclosed space formed as an ellipsoid obtained by rotating an ellipse around an axis passing through first and second focal points and the radiator supported in such a manner that the radiation center of the radio wave of the radiator is located in the neighborhood of the first focal point of the ellipse;

a receiving antenna support unit which supports the receiving antenna with the central position thereof located in the neighborhood of the second focal point of the ellipse; and a moving unit which moves at least selected one of the radiator and the receiving antenna along the axis passing through the first and second focal points, wherein the radio wave radiated from the radiator is reflected on the wall surface and received by the receiving antenna while at the same time changing the relative positions of the radiator and the receiving antenna by the moving unit thereby to maximize the output signal power of the receiving antenna.

According to a tenth aspect, there is provided a radiated power measurement apparatus comprising:

the radiated power measurement coupler according to the ninth aspect;

a power measurement unit which determines the power of the output signal of the receiving antenna of the radiated power measurement coupler;

a signal supply unit which supplies a signal from outside the radiated power measurement coupler to the reference antenna supported on the radiator support unit; and a measurement control unit which drives the moving unit with the DUT supported on the radiator support unit and detects the maximum value of the power of the output signal of the receiving antenna as a measurement value thereby to calculate the total radiation power of the DUT based on the measurement value.

According to a eleventh aspect of the invention based on the tenth aspect, there is provided a radiated power measurement apparatus comprising:

the radiated power measurement coupler according to the ninth aspect;

a power measurement unit which determines the power of the output signal of the receiving antenna of the radiated power measurement coupler;

a signal supply unit which supplies a signal from outside the radiated power measurement coupler to the reference antenna supported on the radiator support unit; and a measurement control unit which drives the moving unit with the DUT supported on the radiator support unit and detects the maximum value of the power of the output signal of the receiving antenna as a first measurement value, the reference antenna being installed in place of the DUT, the moving unit being driven with the signal supplied to the reference antenna from the signal supply unit to set the power of the output signal of the receiving antenna to be maximized, the output signal of the signal supply unit being variably controlled so that the maximum value of the power at the installation position is equal to the first measurement value thereby to determine the output signal power obtained by the control operation as a second measurement value, the total radiated power of the DUT being calculated based on the first measurement value, the second measurement value and the reflection coefficient and the loss of the reference antenna.

According to a twelfth aspect of the invention based on the tenth aspect, there is provided a radiated power measurement apparatus comprising:

the radiated power measurement coupler according to the ninth aspect;

a power measurement unit which determines the power of the output signal of the receiving antenna of the radiated power measurement coupler;

a signal supply unit which supplies a signal from outside the radiated power measurement coupler to the reference antenna supported on the radiator support unit; and a measurement control unit which drives the moving unit with the DUT supported on the radiator support unit and detects the maximum value of the power of the output signal of the receiving antenna as a first measurement value, the reference antenna being installed in place of the DUT, the moving unit being driven with the signal supplied to the reference antenna from the signal supply unit to set the power of the output signal of the receiving antenna to be maximized, the signal power supply to the reference antenna being changed thereby to determine calibration data indicating the relation between the signal power and the output signal of the receiving antenna, the total radiated power of the DUT being calculated based on the first measurement value, the calibration data and the reflection coefficient and the loss of the reference antenna.

According to a thirteenth aspect of the invention based on the tenth aspect, there is provided a radiated power measurement apparatus comprising:

the radiated power measurement coupler according to the ninth aspect;

a power measurement unit which determines the power of the output signal of the receiving antenna of the radiated power measurement coupler;

a signal supply unit which supplies a signal from outside the radiated power measurement coupler to the reference antenna supported on the radiator support unit; and a measurement control unit which drives the moving unit with the DUT supported on the radiator support unit and determines the power for each frequency in a predetermined frequency range to be measured, with respect to the output signal of the receiving antenna at each antenna position thereby to detect the maximum value for each frequency as a third measurement value, at least one of a reference antenna and the receiving antenna being moved along the axis passing through the first and second focal points, the reference antenna being installed in place of the DUT and supplied with a signal to radiate the radio wave, the power being determined for each frequency to be measured with respect to the output signal of the receiving antenna at each antenna position thereby to detect the data including the maximum power for each frequency as a fourth measurement value, the total radiated power of the DUT being calculated in the predetermined frequency range based on the third measurement value, the fourth measurement value and the reflection coefficient and the loss of the reference antenna.

According to an fourteenth aspect based on the thirteenth aspect, there is provided a radiated power measurement apparatus, wherein in the case where the reference antenna is used in place of the DUT, the measurement control unit determines, as the fourth measurement value, the calibration data indicating the relation between the signal power supplied to the reference antenna and the power of the corresponding output signal of the receiving antenna.

According to a fifteenth aspect of the invention based on any one of the tenth to fourteenth aspects, there is provided a radiated power measurement apparatus, wherein the measurement control unit moves selected one of the DUT and the reference antenna together with the receiving antenna symmetrically with each other about a center of the first and second focal points.

According to a sixteenth aspect of the invention based on the thirteenth aspect, there is provided a radiated power measurement apparatus comprising:

a memory which stores a spectrum mask of a predetermined standard having a frequency and an output strength; and a determining unit which compares the spectrum mask with the value of the total radiated power of the radio wave for each frequency in a predetermined frequency range to be measured, and determines whether the standard is satisfied or not.

According to an seventeenth aspect of the invention based on the thirteenth aspect, there is provided a radiated power measurement apparatus comprising:

a first adjusting mechanism which adjusts the position of at least one of the DUT and the receiving antenna along at least one of the X, Y and Z axes;

a storage unit which stores the third measurement value each time the position of at least one of the DUT and the receiving antenna is adjusted along at least one of the X, Y and Z axes;

a second adjusting mechanism which adjusts the position of at least one of the reference antenna and the receiving antenna along at least one of the X, Y and Z axes, the reference antenna being installed in place of the DUT and supplied with a signal to radiated the radio wave;

a storage unit which stores the fourth measurement value each time the position of at least one of the reference antenna and the receiving antenna is adjusted along at least one of the X, Y and Z axes; and a processing unit which calculates the total radiated power in the predetermined frequency range of the DUT to be measured, based on the third measurement value, the fourth measurement value and the reflection coefficient and the loss of the reference antenna.

As described above, the concept of this invention is based on a configuration in which the radiation center of the radio wave of a DUT is made to coincide with the position in the neighborhood of the first focal point of an enclosed space defined by a metal wall surface of an ellipsoid obtained by rotating an ellipse around an axis passing through the focal points thereof, and the radio wave radiated from the DUT is reflected on the wall surface and concentrated on a receiving antenna arranged at the second focal point thereby to measure the radiated power of the DUT from the output signal of the receiving antenna. Further, at least one of the DUT and the receiving antenna is moved along the axis passing through the two focal points to maximize the output signal power of the receiving antenna, and this maximum power is stored as a first measurement value, at least one of a reference antenna installed in place of the DUT to receive the signal and radiate the radio wave and the receiving antenna is moved along the axis passing through the two focal points thereby to maximize the output signal power of the receiving antenna, and using the resulting measurement value and the calibration data, the total radiated power of the DUT is calculated.

As a result, the total radiated power can be accurately measured free of effect of the size or directivity of the DUT without being conscious of the multiple reflection.

Also, since the total radiated power of the DUT is determined by determining the maximum power for each frequency, the radiated power of a wide-band radio equipment such as a portable terminal can be accurately measured.

Further, in view of the fact that the DUT or the reference antenna together with the receiving antenna are moved symmetrically with respect to each other about the center between the two focal points, the position of the maximum power can be efficiently specified for a high measurement efficiency.

Furthermore, according to the invention, it is possible to determine easily and quickly whether a predetermined standard is satisfied or not, simply by storing the spectrum mask of the predetermined standard and calculating the value of the total radiated power of the plurality of the frequencies described above.

Moreover, the invention additionally includes a mechanism configured to adjust the position of the DUT and move the DUT not only along the axis but also on a coordinate line different from the axis, i.e. a mechanism to move the DUT three-dimensionally to adjust the position of the DUT. Therefore, the maximum power of the DUT can be accurately determined, with the result that the total radiated power can be calculated with high accuracy.

BRIEF DESCRIPTION OF THE SEVERAL VIEWS OF THE DRAWING

FIG. 7 is a graph showing the comparison between the spectrum mask SM and the value of the total radiated power Pr displayed in the measurement method according to the invention.

FIG. 9 is a graph showing the change in the reflection coefficient and the coupling degree against the frequency change in the measurement method according to an embodiment of the invention.

FIG. 10 is a graph showing the change in the reflection coefficient and the coupling degree against the moving distance $\Delta Z$ of the antennas moved symmetrically with respect to each other along the axis in the metal ellipsoid by the measurement method according to an embodiment of the invention.

FIG. 14A is a pattern diagram for explaining the measurement in the radiated power measurement method according to an embodiment of the invention.

FIG. 14B is a pattern diagram for explaining the calibration of the measurement value obtained by the radiated power measurement method shown in FIG. 14A.

FIG. 16 is a graph showing the relation between the receiving output and the output of the signal generator in the radiated power measurement method according to an embodiment of the invention.

FIG. 17 is a graph showing the change in the reflection coefficient in the cases where, as the transmission antenna, the dipole antenna and the loop antenna are used in the radiated power measurement method according to an embodiment of the invention.

FIG. 18 is a graph showing the change in coupling degree in the cases where, as the transmission antenna, the dipole antenna and the loop antenna are used in the radiated power measurement method according to an embodiment of the invention.

FIG. 19 is a graph showing the change in reflection coefficient in the case where a radio wave absorber is laid on a part of the section in the coupler of the antenna in the radiated power measurement method shown in FIG. 12.

FIG. 20 is a graph showing the change in coupling degree in the case where a radio wave absorber is laid on a part of the section in the coupler of the antenna in the radiated power measurement method shown in FIG. 18.

FIG. 22 is a flowchart showing another example of the process from the position adjustment to the measurement of the total radiated power of the DUT in the measurement method according to the invention.

FIG. 24 is a sectional view schematically showing the coupler of FIG. 23.

FIG. 25A is a partial sectional view showing an example of the structure of the coupler, in open state, for preventing the leakage of the radio wave in the measurement apparatus according to an embodiment of the invention.

FIG. 25B is a partial sectional view showing the coupler of FIG. 25A in closed state.

FIG. 26A is a plan view schematically showing an example of the configuration of the DUT and the support unit of the receiving antenna in the measurement apparatus according to an embodiment of the invention.

FIG. 26B is a plan view schematically showing an example of the configuration of the DUT and the support unit of the receiving antenna in the measurement apparatus according to an embodiment of the invention.

DETAILED DESCRIPTION OF THE INVENTION (Description of Radiated Power Measurement Method)

The radiated power measurement method and the measurement apparatus according to an embodiment of the invention are explained below with reference to the drawings.

First, the radiated power measurement method illustrated in the IEICE Technical Report AP2007-192 (2008-03), pp. 113-118 "Total radiated power (TRP) measurement of small radio terminals using a spheroidal coupler" constituting the basic technique of the invention is explained. This document is incorporated into this specification as a part thereof.

The radiated power measurement method according to the invention basically utilizes, for measuring the radio wave, the characteristics of the geometrical optics that, as described in the IEICE Technical Report AP2007-192 (2008-03), pp. 113-118 "Total radiated power (TRP) measurement of small radio terminals using a spheroidal coupler", inside a metal wall defining an ellipsoidal space formed by rotating an ellipse, a line segment passing through a first focal point of the ellipsoidal space and reflected on the wall surface always passes through a second focal point.

(Explanation of Basic Principle)

Figure 1:
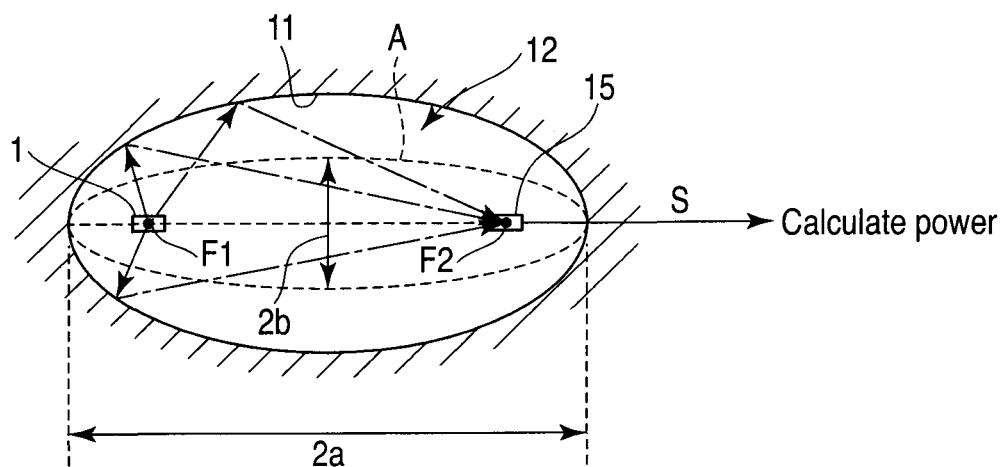
FIG. 1 is a pattern diagram for explaining the radiated power measurement method constituting the foundation of the present invention.

The basic principle of the radiated power measurement method according to the invention is explained more specifically below. As shown in FIG. 1, assume that inside an enclosed space (ellipsoidal space) 12 surrounded by a metal wall surface 11 formed as an ellipsoid obtained by rotating an ellipse A around the long axis (or the short axis) thereof, a DUT 1 is arranged at one of first and second focal points F1, F2, or at the position of the first focal point F1, for example, on the axis of rotation (long or short axis) in such a manner that the radiation center of the radio wave of the DUT 1 substantially coincides with the first focal point F1. Then, a radio wave W radiated from the DUT 1 into the environment thereof is reflected on the wall surface 11 and converged on a receiving antenna 15 arranged at the position of the second focal point F2.

Now, as shown in FIG. 1, the ellipsoid is formed in such a manner that an ellipse A having a long axis length $2a$ and a short axis length $2b$ is extended along the long axis (z axis) and rotated around the axis passing through the first and second focal points F1 and F2. This ellipsoid is expressed by the following equation.

$$(x2/b2)+(y2/b2)+(z2/a2)=1$$

Figure 2:
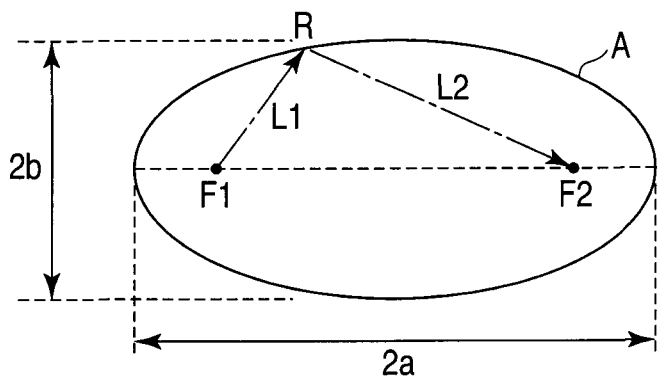
FIG. 2 is a pattern diagram for explaining the characteristics of the metal ellipsoid shown in FIG. 1.

From the viewpoint of the geometrical optics, as shown in FIG. 2, assume that the distance from the first focal point F1 to a given reflection point R on the wall surface 11 is designated as L1, and the distance from the reflection point R to the second focal point F2 is designated as L2. The sum L of these two distances is given as $$L=L1+L2=2a$$

indicating that any light ray radiated from the first focal point F1 in whichever direction and reflected once on the wall surface 11 is input to the position of the second focal point F2 at the same timing.

The eccentricity e of this ellipse is given as $$e=[1-(b^2/a^2)]^{1/2}$$

and the coordinates z of the first and second focal points F1 and F2 are expressed as $$z=\pm f=\pm ae$$

Like in the geometrical optics, the radio wave radiated from the first focal point F1 is similarly concentrated at the second focal point F2. As long as the radio wave is radiated at the first focal point F1 by the DUT 1 and received by the receiving antenna at the second focal point while the power of the output signal S from the receiving antenna 15 is detected, therefore, the total radiated power TRP into the environment by the DUT 1 can be determined by processing the detection signal.

Incidentally, assume that the DUT 1 radiates the continuous wave of a single frequency and the power of the radio wave (direct wave) radiated directly toward the receiving antenna 15 by the DUT 1 is ignorably smaller than the radiated power, and that the radio wave input to the receiving antenna 15 is absorbed into the receiving antenna 15 in its entirety substantially free of loss. Then, by measuring the power of the output signal S of the receiving antenna 15 with a wattmeter, the total radiated power TRP of the DUT 1 can be measured.

Actually, however, as described above, the radio waves input to the receiving antenna 15 are not limited to the primary wave radiated from the DUT 1, reflected once on the wall surface 11 and reaching the receiving antenna 15 at the second focal point F2. In addition, not only the secondary wave constituting a part of the primary wave reflected again on the wall surface 11, returned to the first focal point F1, further reflected on the surface 11 and input to the receiving antenna 15 at the second focal point F2, but also the radio wave of still higher harmonics are input to the receiving antenna 15. In the presence of the multiple reflections, a large standing wave occurs in the ellipsoidal space, and the electromagnetic wave in the ellipsoidal space has a complicated distribution, thereby making it difficult to measure the total radiated power accurately. Also, under this condition, the problem is posed that the input impedance of the antenna of the DUT 1 is considerably different from the input impedance in the free space due to the coupling with the ellipsoidal space.

In order to solve this problem, according to the IEICE Technical Report AP2007-192 (2008-03), pp. 113-118 "Total radiated power (TRP) measurement of small radio terminals using a spheroidal coupler", a method is employed in which a radio wave absorber is arranged in the ellipsoidal space, and only the primary wave is separately extracted to measure the total radiated power by separating the burst signal of a short pulse temporally, or the like.

In the method according an embodiment of the invention, unlike in the IEICE Technical Report AP2007-192 (2008-03), pp. 113-118 "Total radiated power (TRP) measurement of small radio terminals using a spheroidal coupler", the positions of the DUT and the receiving antenna are changed along the axis passing through the focal points F1, F2 on the one hand, and the positions of the reference antenna arranged in place of the DUT and the receiving antenna are similarly changed along the axis passing through the focal points F1, F2 on the other hand. Then, the positions where the power of the receiving signal is maximum, i.e. the positions where the coupling degree between the DUT or the reference antenna, as the case may be, and the receiving antenna is unity is found, and based on the power of the receiving signal involved, the total radiated power TRP of the DUT is measured.

Figure 3:
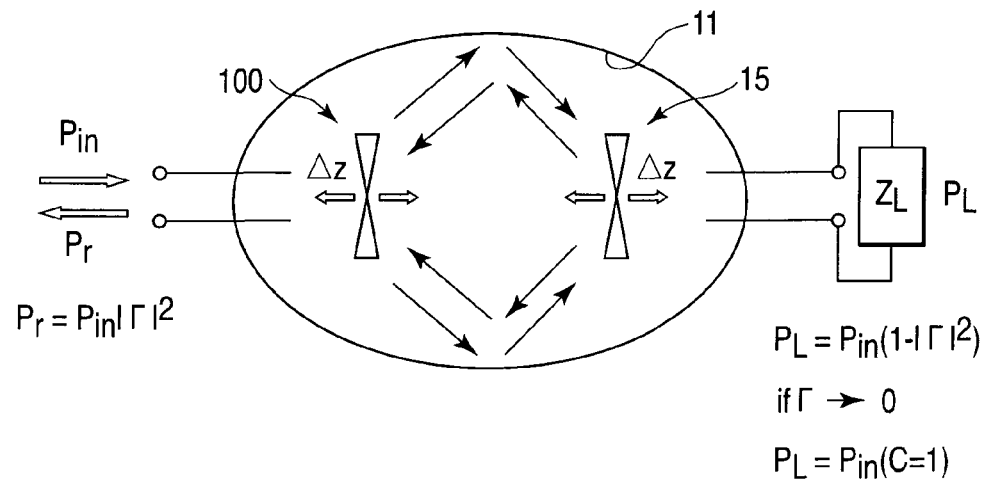
FIG. 3 is a pattern diagram for explaining the measurement method according to the invention.

More specifically, an explanation is given with reference to a model as shown in FIG. 3. In the model shown in FIG. 3, a load ZL is connected to the antenna terminal of the receiving antenna 15, and at the time of inputting the input power Pin to the transmission antenna 100, the power PL is retrieved into the load ZL from the receiving antenna 15. In the case where the transmission antenna 100 has the input reflection coefficient Γ, the reflection power Pr is output from the transmission antenna 100. As a result, the relation PL=Pin(1−|Γ|²) holds. In the model shown in FIG. 3, the positions of the transmission antenna 100 and the receiving antenna 15 are changed along the axis, and once the input reflection coefficient Γ becomes 0 (Γ→0), the coupling degree between the transmission antenna and the receiving antenna becomes unity and the power PL of the receiving signal is maximized.

As explained with reference to FIG. 3, the coupling degree C. between the transmission antenna 100 and the receiving antenna 15 is increased and a more desirable measurement can be obtained by measuring the total power including the multiple reflection components as well as the primary reflection wave. In view of the fact that the interior of the ellipsoidal coupler is regarded free of loss, the reflected power Pr is decreased to a negligibly small value as compared with the input power Pin by sufficiently decreasing the input reflection coefficient Γ of the transmission antenna 100, for example. Then, substantially all the power radiated from the transmission antenna 100 should be recovered to the load ZL on the receiving antenna 15 side. In other words, an ideal coupler having the coupling degree of unity (C=1) can be realized. This fact is established regardless of the size and the directivity of the antenna.

Various experiments show that the reflection coefficient Γ of the transmission antenna 100 in the coupler is considerably changed upward and downward with respect to the frequency under the influence of the multiple reflections. In the case where the positions of the transmission antenna 100 and the receiving antenna 15 are changed by a displacement amount ΔZ along the axis of the ellipse, for example, the phase of the multiple reflection wave is changed, and the position minimizing the reflection coefficient Γ of the transmission antenna 100, i.e. the position maximizing the power PL of the signal output of the receiving antenna 15 can be found. This maximum power PL corresponds to the total radiated power TRP of the transmission antenna 100, and the relation Pin=PL (C=1) holds.

In geometrical optics, it is known that with slight displacement of a wave source at the focal point of a spheroid, the wave reflected on the surface of the spheroid is converged at a position with point symmetry about the center of the spheroid. Also, in the measurement of the electromagnetic wave, the larger the displacement amount ΔZ from the focal point, of course, the lower the convergence degree, but the power density at the symmetric point is maximized.

Figure 4:
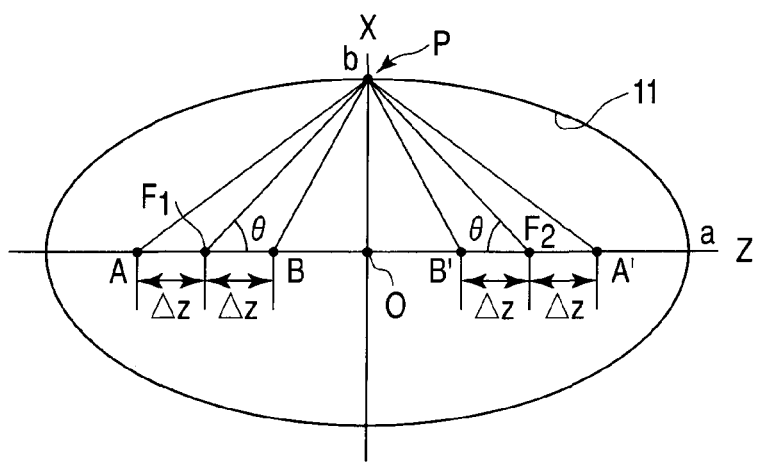
FIG. 4 is a pattern diagram for explaining the measurement method according to the invention.

As shown in FIG. 4, consider a case in which transmission points (F1, A, B, etc.) and receiving points (F2, A', B', etc.) are shifted by the change amount ΔZ symmetrically from the first and second focal points F1, F2 along a Z axis. FIG. 4 assumes that the transmission point F1 is shifted to the transmission point A or B, and the receiving point F2 is shifted to the receiving point A' or B'. The transmission point A is symmetric with respect to the receiving point A', and the transmission point B with respect to the transmission point B'. Let P be a given point on the reflection surface at which the short axis orthogonal to the long axis Z passes through the center 0 of the ellipsoidal space. The phase difference Δϕ between the length of the longest path APA' and the length of the shortest path BPB' is approximately expressed as described below.

$$\Delta\phi \approx 4k\Delta Z$$

$$\cos\theta = 4ke\Delta Z \quad (1)$$

where k is the number of waves (=λ/2π, λ: wavelength) and e the eccentricity.

In the case where the change amount ΔZ is changed within a predetermined range, the interference occurs between the primary and secondary waves, between the secondary and tertiary waves, and so on, reaching the receiving antenna 15, thereby causing a ripple. In the case where these waves are applied in the same phase, the receiving power received by the receiving antenna 15 is maximized, whereas they are offset in the opposite phase. In the case where the receiving power is maximum, as described above, the reflection coefficient at the transmitting end is minimized.

The secondary wave constitutes the return wave of the primary wave, and the tertiary wave the return wave of the secondary wave along the path length shown in FIG. 4. Thus, the phase difference between the longest path length and the shortest path length is twice as large as the value expressed in Equation (1). By changing the change amount ΔZ in such a manner that the phase difference is not less than 2π, the resulting wave always contains the maximum and minimum values of the ripple therein. In other words, the condition is set as follows:

$$(8e\Delta Z)/\lambda \geq 1 \quad (2)$$

Incidentally, with regard to the basic principle of the measurement method described above, it should be noted that since the total radiated power may be sufficiently received from the DUT 1 by the receiving antenna 15, the metal wall surface 11 reflecting the radio wave radiated from the DUT 1 may not necessarily define a completely ellipsoidal enclosed space 12. Specifically, the ellipsoidal enclosed space 12 may be defined in a form cut along a plane parallel to the short axis of the ellipse, and such a form cut the ellipsoidal enclosed space 12 may be defined by the metal wall surface 11. The surface corresponding to the cutting surface may be formed as a flat surface of a radio wave absorber or a conductor. In the case where the flat surface corresponding to the cutting surface is formed of a conductor, the flat surface portion operates as a ground and the receiving power remains unchanged. Therefore, the magnification is not required to be taken into consideration for calculating the total radiated power.

Also, the ellipsoidal space may be a partial space of an ellipsoid including short and long axes of the ellipse and defined by a first plane parallel to the short axis of an ellipse and a second plane formed by rotating the first plane by 90 degrees around the long axis of the ellipse, i.e. a partial space one fourth the size of the ellipsoidal space. In the case where the cutting section defining the partial space is formed of a radio wave absorber, the receiving power is one fourth smaller and increased four times to calculate the total radiated power. In the case where the cutting section defining the partial space is formed of a conductor, on the other hand, the flat surface portion operates as a ground, and the receiving power remains unchanged. Therefore, the magnification is not required to be taken into consideration to calculate the total radiated power.

In this specification and the scope of claims hereof, the term "the ellipsoidal enclosed space" or "the ellipsoidal space" includes not only a completely ellipsoidal space but also an enclosed space constituting a part of the completely ellipsoidal space, and this partial enclosed space may form a part of the completely ellipsoidal space.

Incidentally, in the case where the coupler is formed in a size one half or one fourth the size of the ellipsoidal space, both the size and weight can be decreased, thereby facilitating the relocation and installation. Further, the materials making up the ellipsoidal space are reduced, and therefore, the cost can be reduced advantageously.

(Radiated Power Measurement Method According to First Embodiment)

Figure 5:
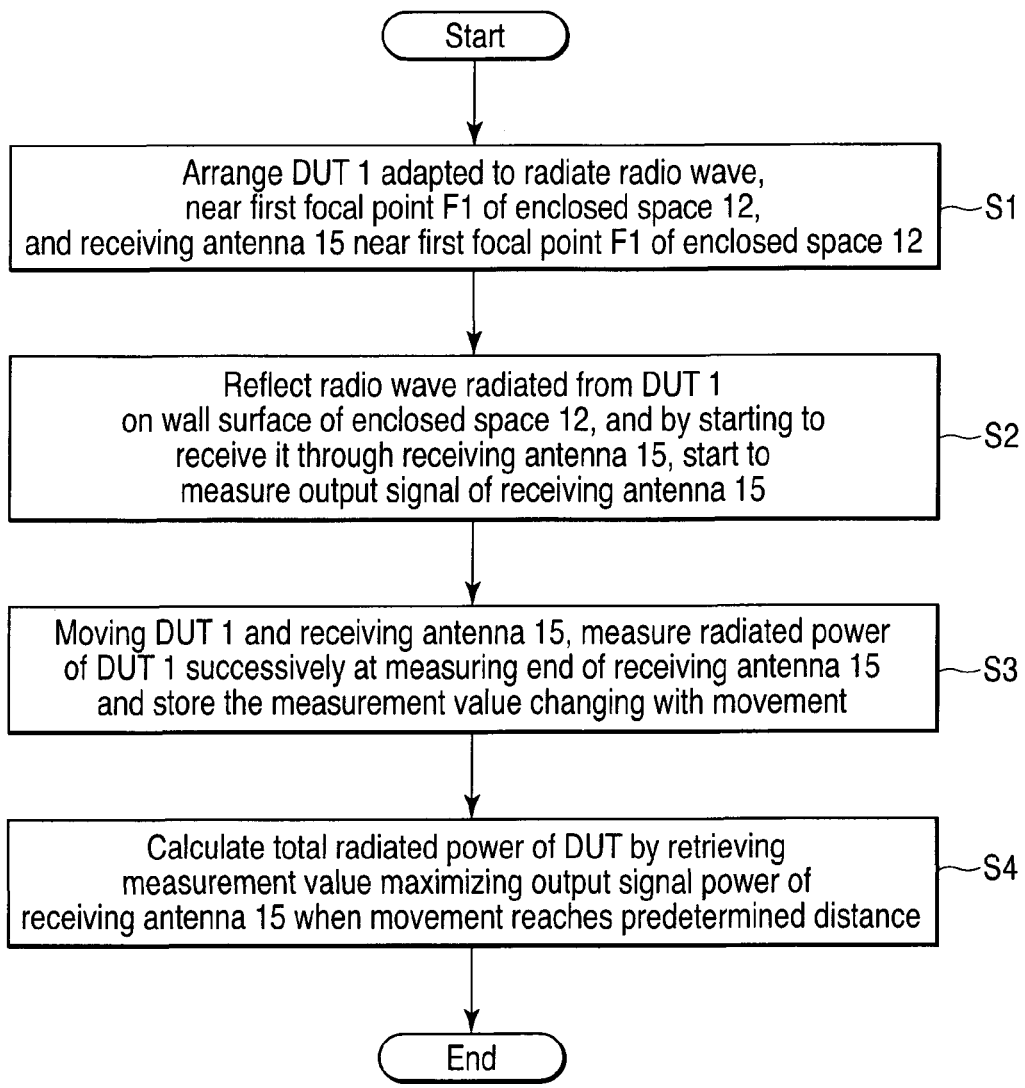
FIG. 5 is a flowchart showing the measurement method according to a first embodiment of the invention.

As understood from the foregoing description, in the radiated power measurement method according to an embodiment of the invention, as shown in FIG. 5, the DUT 1 adapted to radiate the radio wave is firstly arranged in such a manner that the radio wave radiation center substantially coincides with neighborhood of the first focal point F1 of the enclosed space 12 surrounded by the ellipsoidal metal wall surface 11 obtained by rotating the ellipse around the axis passing through the first and second focal points F1, F2. Similarly, the receiving antenna 15 is arranged in such a manner that the antenna center thereof coincides with the neighborhood of the first focal point F1 of the enclosed space 12 (step S1).

The radio wave radiated from the DUT 1 is reflected on the wall surface 11 and begins to be received by the receiving antenna 15 arranged in the neighborhood of the second focal point F2. Then, the radiated power of the DUT 1 begins to be measured from the signal output from the measurement end of the receiving antenna (step S2).

At least one of the DUT 1 and the receiving antenna or both are continuously or intermittently moved along the axis passing through the two focal points F1, F2, while at the same time measuring the radiated power of the DUT 1 successively at the measuring end of the receiving antenna 15 thereby to store the change in the measurement value due to the movement (step S3). The DUT 1 and the receiving antenna, if both are moved, are desirably moved by an equal distance $\Delta Z$ toward or away from each other.

At the time point when this movement reaches a predetermined distance, a measurement value maximizing the output signal power of the receiving antenna 15 is retrieved thereby to calculate the total radiated power of the DUT (step S4).

(Radiated Power Measurement Method According to Second Embodiment)

Figure 6:
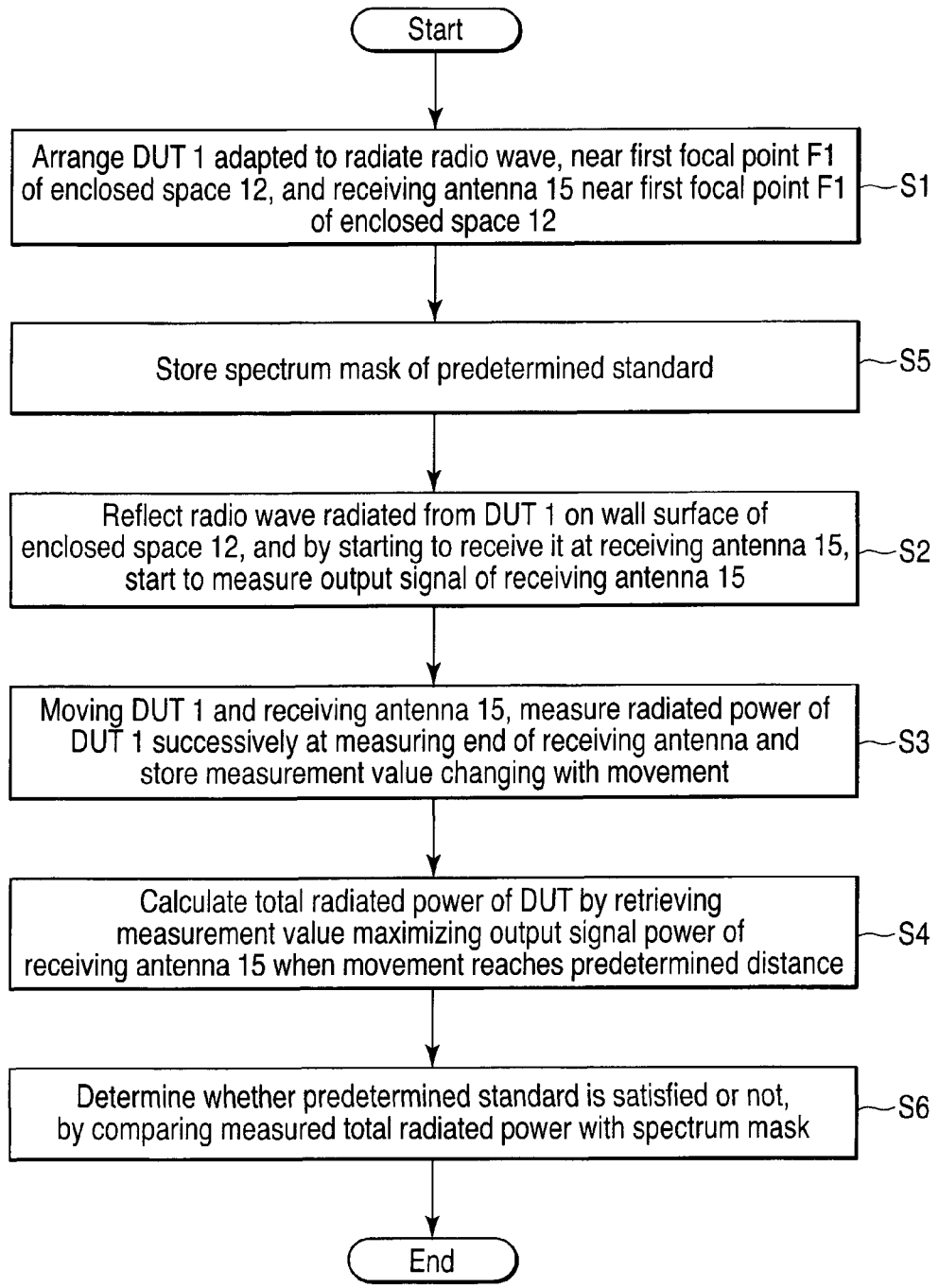
FIG. 6 is a flowchart showing the measurement method according to a second embodiment of the invention.

The measurement method shown in FIG. 5 may include the step of determining whether the total radiated power satisfies the spectrum mask standard as shown in FIG. 6. Specifically, in the measurement method shown in FIG. 5, the DUT 1 and the receiving antenna 15 are arranged in step S1, followed by step S5 to store the spectrum mask of a predetermined standard having a predetermined frequency and a predetermined output strength in advance for the radio wave radiated from the DUT 1.

Next, the measurement of the output signal at the receiving antenna is started in step S2. In step S3, the DUT 1 and the receiving antenna are continuously or intermittently moved, while at the same time measuring the radiated power of the DUT 1 successively at the measuring end of the receiving antenna 15 thereby to store the change in the measurement value with the movement.

In step S4 when the movement reaches a predetermined distance, a measurement value maximizing the output signal power of the receiving antenna 15 is retrieved thereby to calculate the total radiated power of the DUT.

The total radiated power calculated in step S4 is compared with the spectrum mask stored in step S5 thereby to determine whether a predetermined standard is satisfied or not (step S6).

Incidentally, step S5 for storing the spectrum mask of the predetermined standard, as shown in FIG. 6, is not necessarily executed immediately before step S2, but may be executed before comparison with the total radiated power as shown in step S6. With regard to the radio wave radiated from the DUT 1, the spectrum mask of a predetermined standard having a predetermined frequency and a predetermined output strength may be stored in advance, for example, before starting the whole process.

Specifically, according to this radiated power measurement method, the spectrum mask of IS-95 constituting one of the standards of the portable phone, for example, used as the DUT 1 is stored, and compared with the value Pr of the total radiated power for a plurality of frequencies thereby to determine whether the standard is satisfied or not.

In the case where the value Pr of the total radiated power for a plurality of frequencies satisfies the standard as the result of determination in step S6, "Pass", for example, is displayed on the screen of a display unit (not shown) used in the radiated power measurement apparatus. In the case where the result of determination in step S6 fails to satisfy the standard, in contrast, "Fail", for example, is displayed on the screen of the display unit (not shown) used in the radiated power measurement apparatus, and at the same time, the frequency and the value of the corresponding total radiated power Pr failing to satisfy the standard may be displayed.

Further, with regard to the total radiated power Pr failing to satisfy the standard, the difference from the standard value may be displayed on the screen of the display unit (not shown) in the radiated power measurement apparatus.

Also, the result of determination may be output to a computer or the like external to the radiated power measurement apparatus.

Incidentally, according to this radiated power measurement method, the process of measurement and calculation described above is executed based on the spectral display as shown in FIG. 7 using, for example, the spectrum analyzer. FIG. 7 shows the result of comparison between the value of the total radiated power Pr and the spectrum mask SM for a measurement frequency set.

This process may be replaced with a process using a table containing the measurement frequency, the total radiated power Pr and the power value corresponding to the spectrum mask.

Figure 8:
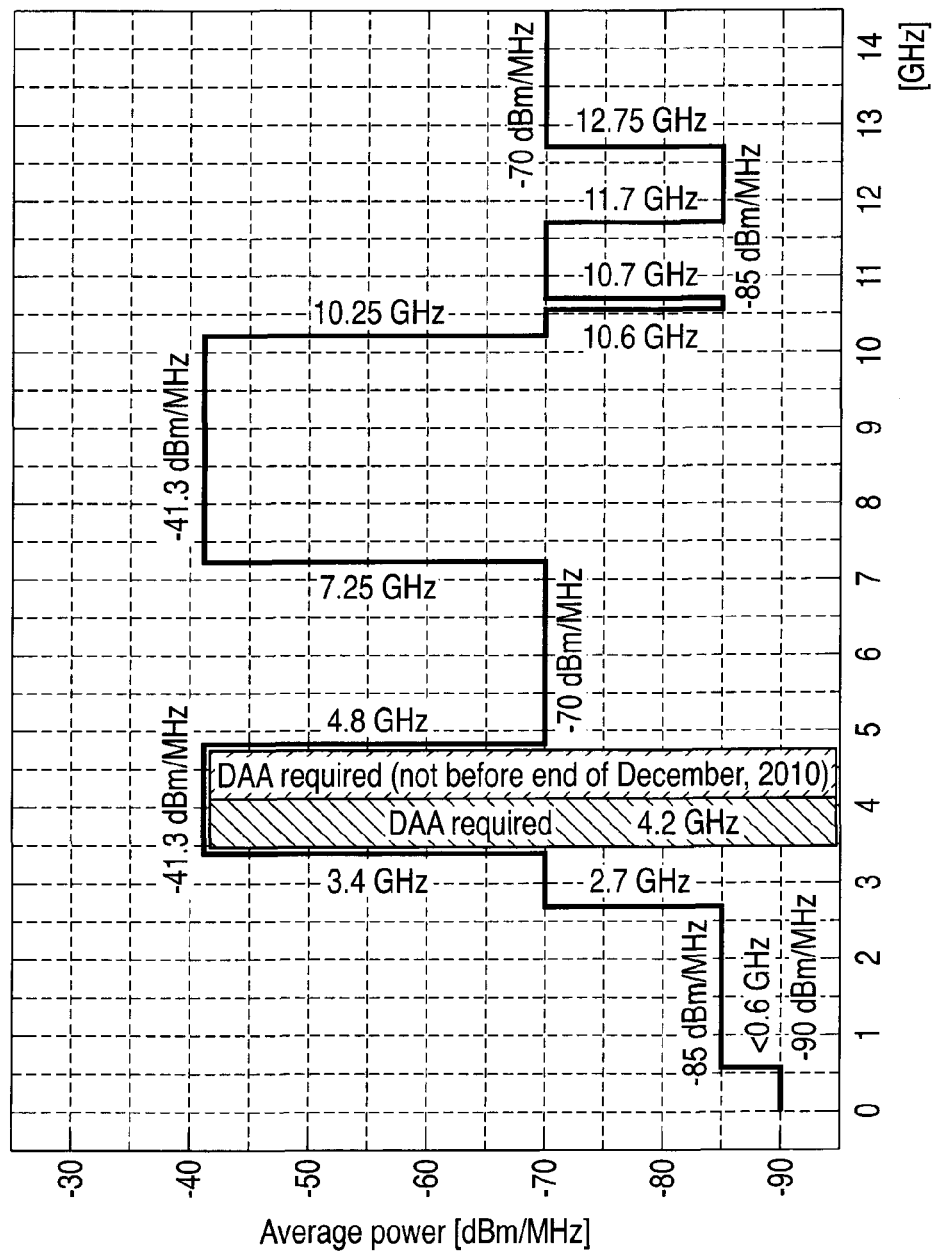
FIG. 8 is a graph showing the spectrum mask used for UWB.

FIG. 8 shows the spectrum mask used for UWB (ultra wide band).

The UWB permits a high-speed data communication within a short distance by sending a pulse signal of a very short period over a very wide band of several hundred MHz to several GHz.

In the UWB, however, the interference is expected to occur at a portion overlapped with the band of other communication methods. Therefore, the technique (DAA: Detect and Avoid) to avoid the interference with other communication methods is incorporated as an obligation, and to meet this obligation, the spectrum mask as shown in FIG. 8 is specified.

The UWB devices are required to have the characteristic satisfying the spectrum mask as shown in FIG. 8. In the radiated power measurement method according to an embodiment of the invention, the determination as to whether the spectrum mask is satisfied or not can be carried out easily and quickly.

(Explanation of Simulation Result)

FIGS. 9 and 10 show the result of simulation based on the measurement method described above.

FIG. 9 shows the result of simulation of transmission and receiving operations in the case where an ellipsoidal reflector (ellipsoidal enclosed space 11) having the long axis length of 40 cm ($2a=4\lambda$) and the eccentricity e of 0.5 is prepared, and a half-wavelength dipole transmission antenna for radiating the transmission wave of 3 GHz in frequency and a half-wavelength dipole receiving antenna for receiving the transmission wave are arranged at the first and second focal points, respectively, of the reflector in coincidence with the centers thereof. In FIG. 9, the solid line designates the reflection coefficient (S11) of the transmission antenna, and the dotted line the coupling degree (transmission) indicating the ratio of the power received by the receiving antenna to the power radiated from the transmission antenna. From FIG. 9, it is easily understood that the reflection coefficient (S11) is as large as 0 dB and the coupling degree (S21) is as small as −50 dB for the central frequency 3 GHz.

FIG. 10 shows the change in the reflection coefficient and the coupling degree at 3 GHz in the case where the transmission and receiving antennas are displaced by the change amount ΔZ along the Z axis symmetrically with respect to each other about the center (Z=0) thereof. A positive value of the change amount ΔZ indicates the change in the reflection coefficient and the coupling degree with the transmission and receiving points moved away from each other outward of the first and second focal points, respectively, while a negative value of the change amount ΔZ, on the other hand, indicates the change in the reflection coefficient and the coupling degree with the transmission and receiving points moved toward each other inward of the first and second focal points, respectively.

From FIG. 10, it is understood that in the case where the transmission and receiving points are moved toward each other by ΔZ=−20 mm, the reflection coefficient of the transmission antenna is reduced to −20 dB and the coupling degree becomes about 0 dB (=1). In the case where the transmission and receiving points are moved away from each other by ΔZ=+20 mm, on the other hand, the reflection coefficient of the transmission antenna is reduced further to −30 dB and the coupling degree approaches 0 dB more. It is also understood that in the case where the transmission and receiving points are displaced by the change amount ΔZ in the range of 20 mm to 50 mm, the reflection coefficient is not more than −20 dB and the coupling degree is maintained at about 0 dB. As long as the positions of the transmission and receiving antennas are set to maximize the receiving power by the displacement thereof, therefore, the reflection coefficient of the transmission antenna for the resulting positions is sufficiently small and the coupling degree is substantially 0 dB. With this arrangement of the transmission and receiving antennas, the receiving power corresponds to the total radiated power (TRP) radiated from the transmission antenna.

Figure 11:
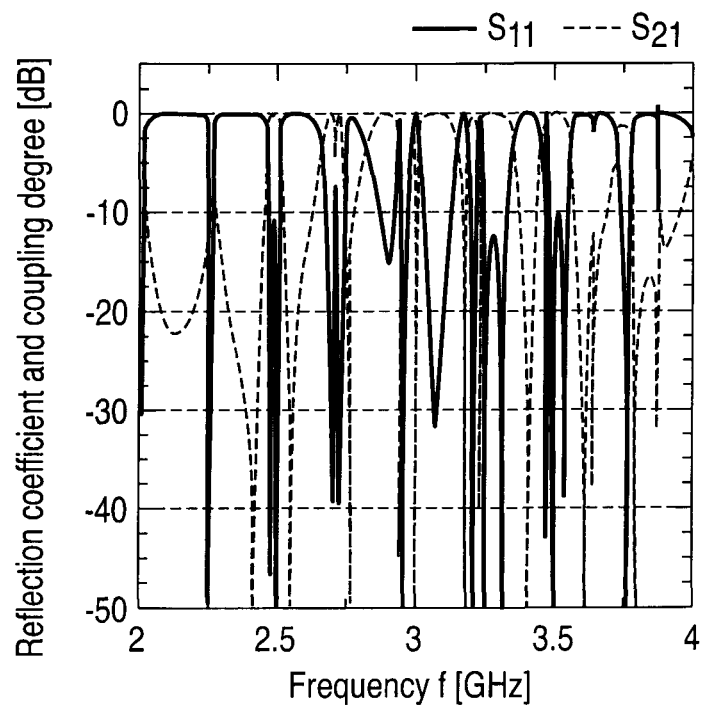
FIG. 11 is a graph showing the change in the reflection coefficient and the coupling degree against the frequency change of larger antennas in the measurement method according to an embodiment of the invention.
Figure 12:
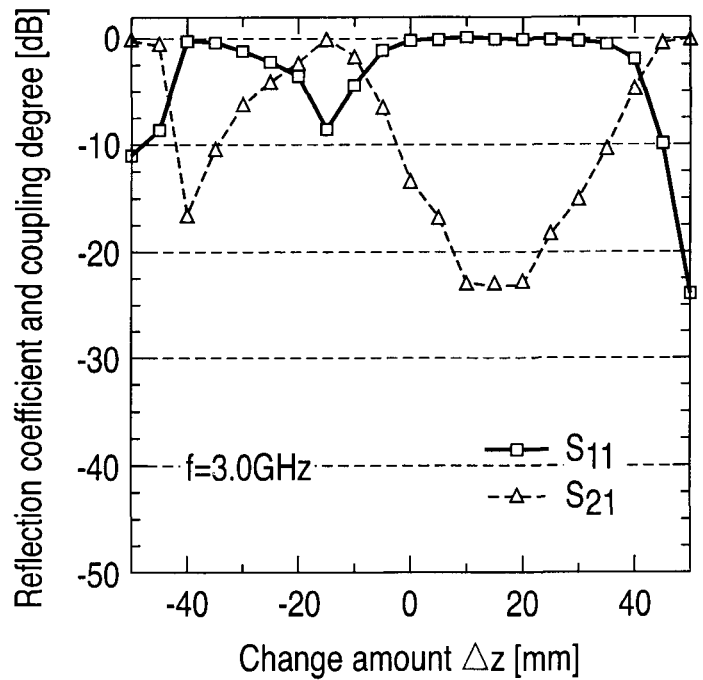
FIG. 12 is a graph showing the change in the reflection coefficient and the coupling degree in the case where the positions of larger antennas are moved symmetrically with respect to each other in the measurement method according to an embodiment of the invention.

FIGS. 11 and 12 show the result of simulation for an ellipsoidal reflector having the total long axis of 50 mm (2a=5λ) and the eccentricity e of 0.5. As shown in FIGS. 11 and 12, the reflection (S11), though reduced with ΔZ=−15 mm, insufficiently fails to reach more than −10 dB. It is understood, however, that in the case where ΔZ is set at +50 mm, the reflection is sufficiently reduced, and the coupling degree (S21) becomes about 0 dB. Therefore, the position associated with ΔZ=+50 mm is found to be the optimum antenna position.

The transmission and receiving antennas, though displaced by a given change amount ΔZ outward of the first and second focal points, respectively, in the simulation described above, may alternatively be displaced inward. Specifically, the same effect is obtained by displacing the transmission and receiving antennas by 2ΔZ inward of the first and second focal points, respectively. In this case, a long focal distance, i.e. a large eccentricity can be selected. As a result, a flat spheroid having a large length of the long axis and a small length of the short axis can be realized, thereby making it possible to reduce the volume occupied by the spheroidal coupler.

(Explanation of Comparison Method)

In actually measuring the total radiated power of the DUT 1 such as a portable terminal, a measurement of higher accuracy is made possible by use of the comparison method described below.

Figure 13:
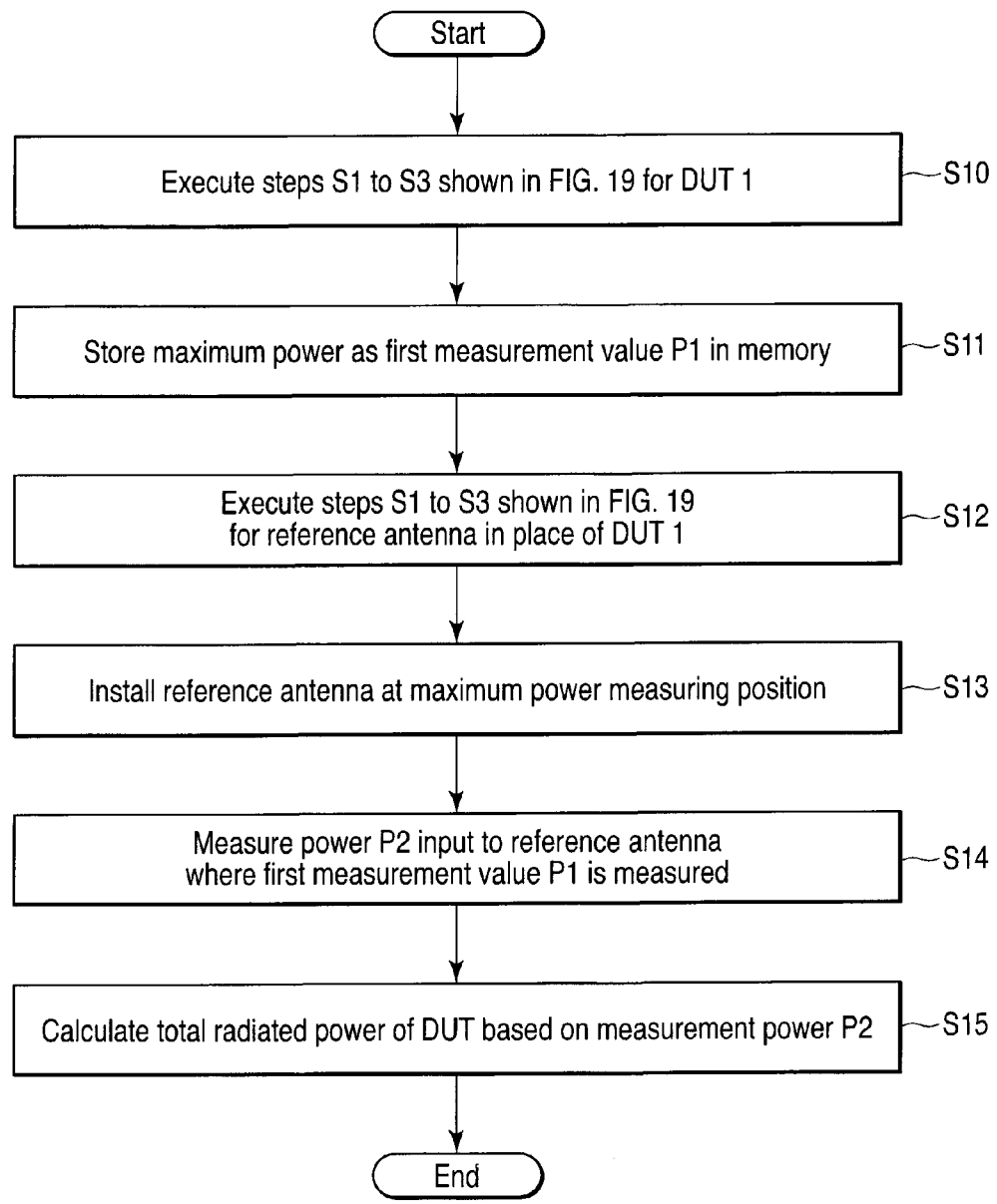
FIG. 13 is a flowchart showing a measurement method based on the calibration by comparison according to the invention.

In the comparison method, the measurement process is executed as shown in FIG. 13. First, as illustrated in FIG. 14A, the radiation center of the DUT 1 and the center of the receiving antenna 15 are arranged at the positions of the first and second focal points F1, F2, respectively. After that, the positions of the radiation center of the DUT 1 and the center of the receiving antenna 15 are displaced symmetrically with respect to each other along the axis passing through the focal points, while at the same time measuring the power of the output signal of the receiving antenna 15 (step S10). By this measurement, the position where the power is maximum is found, and the corresponding maximum power is stored as a first measurement value P1 in a memory (step S11).

Incidentally, in the measurement system shown in FIGS. 14A and 14B, a power meter 150b such as a spectrum analyzer is generally used as a power measurement unit 150 for measuring the power of the output signal of the receiving antenna 15. On the assumption that a low-level radiation such as spurious radiation is measured by this power meter 150b, a LNA (low-noise amplifier) 150a is arranged in the first stage of the power meter 150b.

Next, as shown in FIG. 14B, a reference antenna 160 of a known characteristic having the reflection coefficient r is arranged in place of the DUT 1 in the ellipsoidal coupler (step S12). This reference antenna 160 is connected to an external signal generator 161 through a cable 162 of a known loss (Lc), so that a signal of a frequency (or the central frequency thereof) equal to that of the radiated radio wave of the DUT 1 is supplied from the signal generator 161 to the reference antenna 160 thereby to radiate a radio wave from the reference antenna 160. As in the aforementioned case, the positions of the two antennas are displaced symmetrically, and the output signal of the receiving antenna 15 is measured (step S12). In this measurement, the position of the reference antenna 160 and the power of the receiving antenna are stored in the memory. The positions of the reference antenna 160 and the receiving antenna maximizing the power of the receiving antenna are determined, and the reference antenna 160 and the receiving antenna are set at the particular positions, respectively (step S13). Then, the output of the signal generator 161 is set in such a manner that the maximum receiving signal power is equal to the value P1 stored in the memory, and the particular output value is stored as a second measurement value P2 (step S14).

After that, the total radiated power TRPz of the DUT 1 is determined by the calculation shown below (step S15).

$$TRPz = P2 \cdot Lc(1-|\Gamma|2) \qquad (3)$$

The total radiated power TRPz obtained by this measurement corresponds to the total power of the polarized wave component along the Z axis, and in the case where the DUT 1 has only the Z-axis polarized wave component like the dipole antenna, can be regarded as the total radiated power. In the case where the DUT 1 radiates other polarized wave components, however, the measurement described above is carried out also for the X- and Y-axis polarized waves, and the total sum thereof is determined as $$TRP = TRPz + TRPx + TRPy$$

(Calibration Method Using Comparison Method)

Figure 15:
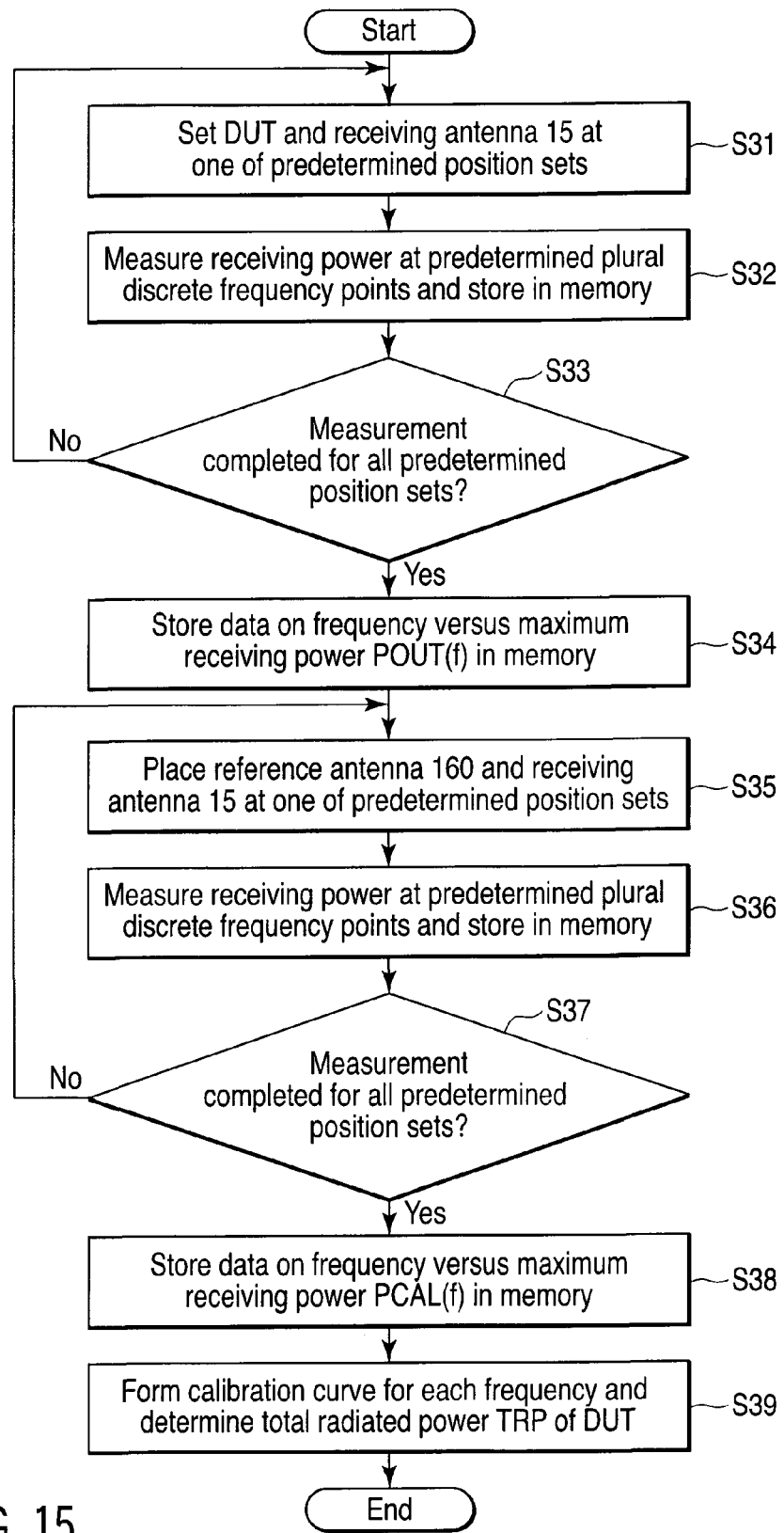
FIG. 15 is a flowchart showing a measurement method using the calibration by comparison according to the invention.

The calibration method using the comparison method is generally used and effective for the point frequency. In the case where the DUT is radio equipment such as an actual portable terminal, however, the signal is modulated and TRP for each frequency component is required to be measured. For this reason, the calibration using the comparison method shown in FIG. 15 is employed.

The frequency sweeping time of the receiver such as the spectrum analyzer used as the power measuring unit 150 is very short. In the case where TRP of the device under test (DUT 1) is measured, therefore, as shown in FIG. 15, the DUT and the receiving antenna 15 are firstly set in one of predetermined position sets (step S31). After frequency sweeping of the receiver, the receiving power at a plurality of predetermined discrete frequency points is measured and the resulting data is stored in a memory (step S32).

Next, step S33 checks whether all the measurements for the predetermined position set of the DUT and the receiving antenna is completed or not (step 3). In the case where all the measurements are not yet completed, the predetermined position set is changed and steps S31 and S32 are executed again. In the case where the predetermined position set is completed, i.e. the process of steps S31 and S32 is executed for all the position sets of the device on test (DUT 1) and the receiving antenna 15, on the other hand, the data on the receiving power is acquired. From the multiplicity of these data, the maximum receiving power at a frequency of each discrete point is extracted, and the data on the frequency versus the maximum receiving power POUT(f) is obtained and stored in a memory (step S34).

Then, the reference antenna 160 is connected to the signal generator 161 through a cable 162 to form a calibration system, and by executing the process of similar steps S35 to S37, the data on the frequency versus the maximum receiving power PCAL(f) is obtained and stored in the memory (step S38). In the process, the output Ps of the signal generator 161 is set to an appropriate value in advance. Also, the loss Lc of the cable 162 and the reflection coefficient Γ of the reference antenna 160 and the like are measured in advance.

In the case where the measurement value is expressed in dB, TRP of the DUT is determined from Equation (4) below. Incidentally, it should be noted that the cable loss and the dB value related to the reflection in Equation (4) are negative.

$$[TRP(f)]dBm = [PDUT(f)]dB - [PCAL(f)]dB + [Ps(f)]dBm + [Lc(f)]dB + |1-\Gamma2(f)|dB \quad (4)$$

This equation applies as long as the receiver input is in the range of linear operation. The receiver used as the power meter 150, however, has a nonlinear characteristic, and in the case where the input has a wider range, the input signal level is required to be calibrated. For this purpose, by changing the output level of the signal generator 161 and repeating the measurement similar to the aforementioned one, the calibration curve shown in FIG. 16 is determined for each frequency. Using this calibration curve, the total radiated power TRP of the DUT is determined (step S39).

Specifically, the calibration curve is determined by first setting the output level of the signal generator 161 at one value and using the position displacement and the frequency change of the reference antenna 160 and the receiving antenna 15, the maximum receiving power for each frequency is determined. Next, the output level of the signal generator 161 is changed, and a similar measurement is conducted for a plurality of signal levels.

The curve determined for each frequency in this way is shown by dashed line A in FIG. 16. For this curve, the cable loss and the reflection coefficient are corrected to obtain a curve B, which is the calibration curve of TRP. Assuming that the maximum receiving power for the DUT is determined as point C, for example, the calibration curve can be used to determine TRP of the DUT at point D.

The radiated power measurement method described above can be established on condition that the coupling degree of the receiving antenna 15 remains the same for the DUT 1 and the reference antenna 160. From FIGS. 9 and 11, ripples are seen to occur periodically. These ripples are generated by the fact that the radio wave reciprocating between the transmission and receiving antennas in the spheroid interferes with the radio wave reflected on the wall surface, and are thus considered to be determined by the shape of the spheroid and the frequency, and basically independent of the shape of the transmission antenna and the DUT.

(Result of Simulation by Antenna Shape)

FIGS. 17 and 18 show the result of simulation to confirm the condition that the coupling degree of the receiving antenna 15 remains the same for the DUT 1 and the reference antenna 160. In FIGS. 17 and 18, the reflection coefficient and the coupling degree are compared for different shapes of transmission antennas including the half-wavelength dipole antenna and the square loop antenna.

In this example, the reflection coefficient and the coupling degree are determined on condition that a radio wave having the central frequency of 7.5 GHz ($\lambda 0=40$ mm) is transmitted and received, the coupler has the long axis length $2a$ of 3.35 $\lambda 0$ and the eccentricity e of 0.3, and the transmission and receiving antennas are arranged at the first and second focal points, respectively.

From the result shown in FIGS. 17 and 18, the coupling degree is seen to have substantially the same frequency characteristic for the two antennas. As shown in FIG. 18, however, the reflection coefficient sharply drops for some frequencies. At these frequencies, the measurement becomes unstable and a large error occurs. In such a case, the positions of the transmission and receiving antennas are adjusted by displacing the transmission and receiving antennas in such a way that the coupling degree is high for the frequency of the DUT and the frequency characteristic is flat. Then, an accurate and stable measurement is made possible.

Further, in order to avoid this unstable phenomenon, the radio wave absorber as shown in the IEICE Technical Report AP2007-192 (2008-03), pp. 113-118 "Total radiated power (TRP) measurement of small radio terminals using a spheroidal coupler" is effectively arranged in the coupler.

FIGS. 19 and 20 show the characteristics of the reflection coefficient and the coupling degree with the radio wave absorber laid in a part of the cutting section in the coupler of the model shown in FIGS. 12 and 17. The provision of the radio wave absorber in the coupler attenuates the multiple reflection waves by absorption and reduces the overall coupling degree. Nevertheless, the ripple is reduced and a stable measurement is made possible. Also, it is understood from FIGS. 19 and 20 that the frequency characteristic of the coupling degree is the same for antennas having different shapes such as the dipole antenna and the square loop antenna. Even in this case, too, the measurement is of course possible with a high coupling degree by displacing the transmission and receiving antennas for the frequencies with a low coupling degree. This process is effective especially for measurement of low-level radiation.

The example described above represents a case in which the radio wave absorber is laid in a part of the cutting section in the coupler. As an alternative, the radio wave absorbing material may be coated uniformly over the entire surface of the internal wall of the spheroid. In the case where the radio wave absorber is arranged at a specified part as described above, the absorption amount may be differentiated under the effect of the DUT or the directivity of the reference transmission antenna. This problem can be obviated, however, by coating the radio wave absorber uniformly over the entire surface of the internal wall of the spheroid. Epoxy rubber or the like resin material of rubber group, for example, can be used as the material of radio wave absorber.

(Radiated Power Measurement Method According to Third Embodiment)

The radiated power measurement method according to a third embodiment is different from the aforementioned first embodiment in that the process of steps S2 and S3 to start the measurement of the total radiated power at the measurement end of the receiving antenna 15 and complete the measurement is executed not only along the axis (z axis) connecting the first and second focal points F1, F2 but also along other axes (Y and X axes) orthogonal to the Z axis.

Specifically, in measuring the total radiated power at the measuring end of the receiving antenna 15, the first step is to adjust the position of the DUT 1 along at least selected one of the three-dimensional orthogonal coordinate axes or, for example, a selected axis corresponding to a Y axis orthogonal to the Z axis.

Next, steps S1 to S4 are executed on the axis along which the position of the DUT 1 is adjusted, and the radiated power is measured and stored in a memory.

Similarly, another one of the three-dimensional orthogonal coordinate axes or, for example, an axis corresponding to a X axis orthogonal to the Z axis is selected, and the position of the DUT 1 is adjusted along the particular selected axis. Along this axis on which the position of the DUT 1 is adjusted, steps S1 to S4 are executed so that the radiated power is measured and stored in a memory.

Finally, the remaining one of the three-dimensional coordinate axes or, for example, an axis corresponding to the Z axis is selected, and the position of the DUT 1 is adjusted along the selected axis. Along this axis on which the position of the DUT 1 is adjusted, steps S1 to S4 are executed so that the radiated power is measured and stored in a memory.

After that, like in step S4, the memory is searched, and the total radiated power of the DUT 1 is extracted as a maximum value.

The measurement method in which the three-dimensional coordinate axes are selected one by one to determine the total radiated power of the DUT 1 is not limited to the measuring steps shown in FIG. 5, but the comparison method and the calibration method using the comparison method shown in FIGS. 13 and 15 may alternatively be used with equal effect.

In carrying out the comparison method, as shown in FIG. 13, steps S10 and S11 are executed for the three-dimensional coordinate axes, one by one, of the DUT 1, and similarly, step S12 is executed for the three-dimensional coordinate axes, one by one, of the reference antenna. After that, as shown in step S13, the reference antenna is installed at the maximum power measurement position, followed by execution of steps S14 and S15.

Also, in the calibration using the comparison method, steps S31 to S34 are executed for the three-dimensional coordinate axes, one by one, of the DUT 1, and similarly, steps S35 to S38 are executed for the three-dimensional coordinate axes, one by one, of the reference antenna. After that, as shown in step S39, the calibration curve is formed to determine the total radiated power.

In the radiated power measurement method according to the third embodiment of the invention, the position of the DUT 1 is adjusted for the reason described below.

The radiation center of the radio wave radiated by the DUT 1 from a comparatively ideal antenna such as the dipole antenna constitutes the power feeding point of the dipole antenna. In such a case, the radiation center of the radio wave can be easily specified.

In the actual measuring operation with a great variety of devices on test, however, each type of the device on test has a unique antenna position. Thus, the radio wave radiation pattern from the DUT 1 including the effect of the housing of the DUT 1 and the radiation center of the radio wave radiated from the DUT 1 are varied from one type of the DUT 1 to another. This indicates that the apparent look of the DUT arranged at the focal point of the ellipsoidal space in such a manner as to substantially coincide with the radiation center of the radio wave, therefore, does not always lead to the fact that the DUT 1 is arranged in such a manner that the radiation center of the radio wave thereof substantially coincides with the position of the focal point F1 in the ellipsoidal space. In the case where the DUT 1 is a portable radio equipment having a radiator of ¼ wavelength and the wavelength of the operating frequency thereof is considerably shorter than the housing of the radio equipment, for example, the radiation center of the radio wave tends to be sided to the housing rather than to the power feeding point of the antenna due to the effect of the housing.

Many of the DUT 1 have an antenna built therein. In such a case, it is often totally impossible to identify the antenna position and the radiation center of the radio wave of the DUT 1 from the external appearance. From the external appearance of the DUT 1, therefore, it is difficult to arrange the DUT 1 with the radio wave radiation center thereof substantially coinciding with the focal point F1.

In the case where, as described above, the radiation center of the radio wave of the DUT 1 substantially fails to coincide with the position of the focal point F1 in the ellipsoidal space, the maximum power of the DUT 1 cannot be accurately determined.

In order to determine the maximum power of the DUT 1 accurately, another mechanism is required in which the measuring instrument is moved not only along an axial line (the axial line of the Z axis) but also along a coordinate axis different from the axial line, i.e. a mechanism to move the measuring instrument three-dimensionally. Also, as explained above in the radiated power measurement method according to the third embodiment, it is more desirable to determine the maximum power of the DUT 1 accurately by adjusting the position of the DUT 1.

(First Example of Position Adjusting Operation for DUT 1 (Manual))

A position adjusting unit for the DUT 1 is realized by a mechanism as illustrated in FIG. 7 of Jpn. Pat. Appln. KOKAI Publication No. 2006-322921, in which the position of the DUT 1 can be manually adjusted along at least one of the X, Y and Z axes.

An example of operation using this mechanism as an example of the position adjusting unit of the DUT 1 is explained below.

In the case where the position adjusting mechanism shown in FIG. 7 which is disclosed in Jpn. Pat. Appln. KOKAI Publication No. 2006-322921 is used as an example of the position adjusting unit for the DUT 1, the DUT 1 is adjusted at a predetermined position manually along at least one of the X, Y and Z axes. Each time of position adjustment, the output signal of the receiving antenna 15 is measured and the position of the DUT 1 associated with the maximum output power from the receiving antenna 15 is retrieved.

Incidentally, the position adjusting unit for the DUT 1 is not limited to the mechanism shown in FIG. 7 of Jpn. Pat. Appln. KOKAI Publication No. 2006-322921 as described above, but any mechanism may alternatively be employed in which the position of the DUT 1 can be manually adjusted along at least one of the X, Y and Z axes.

Assume that the DUT 1 of a predetermined type is reinspected after retrieving a satisfactory position of the DUT 1. To permit the measurement at the particular position, as shown in FIG. 7 of Jpn. Pat. Appln. KOKAI Publication No. 2006-322921 described above, an English letter or another identifiable mark for the particular type may be attached to a mount and a hole thereof.

In FIG. 7 which is disclosed in Jpn. Pat. Appln. KOKAI Publication No. 2006-322921, therefore, the satisfactory position of the DUT 1 is indicated by the predetermined English letter or the mark, and therefore, can be easily reset based on the English letter or the mark, as the case may be, on the reference surface viewed from the hole of the mount.

(Second Example of Position Adjusting Operation for DUT 1 (Automatic))

Figure 23:
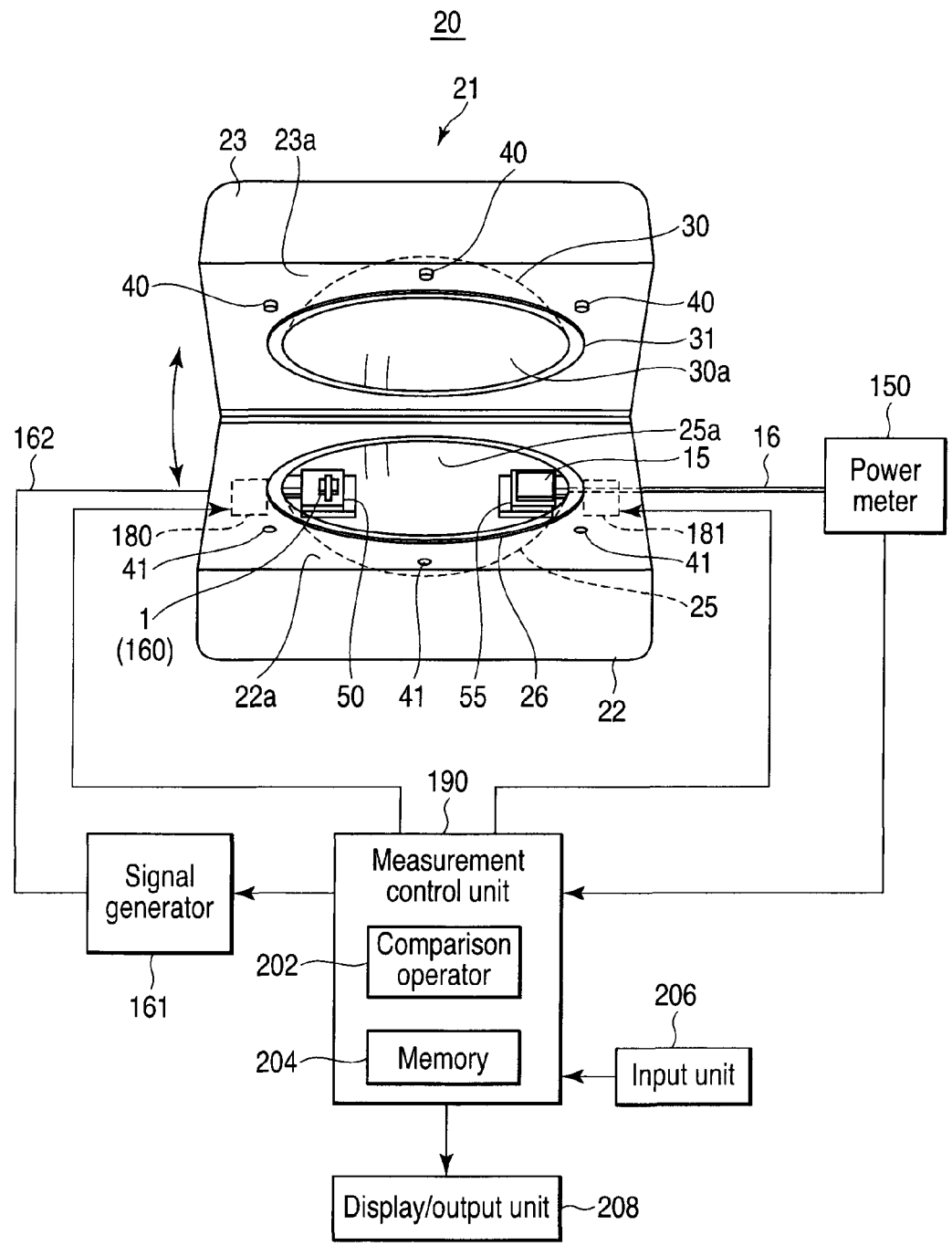
FIG. 23 is a perspective view schematically showing a measurement apparatus according to an embodiment of the invention.

The position adjusting unit used in the first example of the position adjusting operation for the DUT 1 described above may alternatively be so configured that the position of the DUT 1 is adjusted automatically using first and second external mechanisms 180, 181. Specifically, the position adjusting unit may further include mechanisms driven along at least one of the X, Y and Z axes, and the position of the DUT 1 may be adjusted automatically in accordance with the drive signal from a measurement control unit 190 constituting a control unit as shown in FIG. 23.

Figure 21:
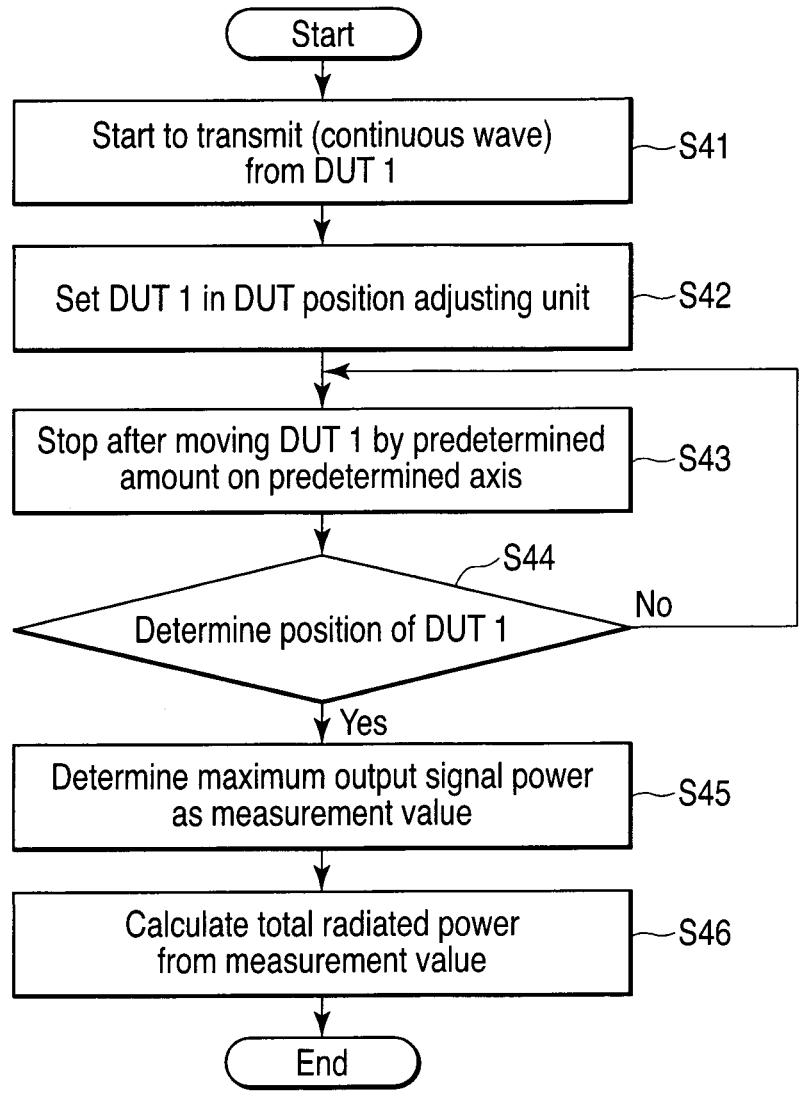
FIG. 21 is a flowchart showing an example of the process from the position adjustment to the measurement of the total radiated power of the DUT in the measurement method according to the invention.

In measuring the total radiated power of the DUT 1 by automatic position adjustment as described above, the measuring operation is performed, for example, as shown in FIG. 21.

First, the operation button for the DUT 1 is depressed into a state to start the transmission of a continuous wave (step S41). Under this condition, the DUT 1 is mounted on the position adjusting unit (position adjusting mechanism), and after position adjustment, set in the neighborhood of the first focal point (step S42). This DUT 1 is stopped after being moved by a predetermined amount $\Delta Z$ on a predetermined axis (step S43) by the position adjusting unit. In this stationary state, the radiated power output from the receiving antenna is measured, and as described above, the power measurement value is stored in a memory. This power measurement value is compared with the radiated power measurement value already obtained to check whether the former is larger than the latter stored in the memory. The radiated power output from the receiving antenna, when measured for the first time, is compared with the reference power (threshold value) in the memory (step S44). In the case where the power measurement value is smaller than other power measurement values or the reference power, the process is returned to step S42, and the DUT 1 is stopped after being moved over the distance $\Delta Z$ again by the position adjusting mechanism (step S42). Each time the DUT 1 is inched by the position adjusting mechanism, the power measurement value is stored in a memory, and once the DUT 1 is moved within a certain range, the power measurement value is compared with the one stored in the memory. Thus, the maximum measurement of the radiated power is determined thereby to determine the position of the DUT 1 where the particular maximum radiated power is output (step S44).

Next, as described above, the total radiated power is determined from this measurement value of the maximum radiated power, and the process is ended (steps S45 and S46).

Prior to the process of step S41 shown in FIG. 21, the process of steps S42 and S43 may be executed as shown in FIG. 22. Specifically, the DUT 1 is mounted on the position adjusting unit (position adjusting mechanism), and set in the neighborhood of the first focal point by being moved over a predetermined distance $\Delta Z$ on a predetermined axis by the position adjusting mechanism (step S43). After that, the DUT 1 may start to transmit the continuous wave (step S41). The process of steps S44 to S46 after this transmission are identical with the process shown in FIG. 21 and therefore not explained again.

Next, the DUT 1 is set in the position adjusting unit thereof (step 553).

(Explanation of Radiated Power Measurement Apparatus)

FIG. 23 shows a general configuration of a radiated power measurement apparatus 20 based on the measurement principle described above.

The radiated power measurement apparatus 20, as understood from the explanation made above about the measurement principle, includes a radiated power measurement coupler (hereinafter referred to simply as the coupler) 21 configured to measure the radiated power. This coupler 21 has a receiving antenna 15 and a DUT 1 or a reference antenna (transmission antenna) 160 used in place of the DUT 1. The receiving antenna 15 is connected with a power measuring unit 150 configured to measure the power output from the receiving antenna 15, and the DUT 1 or the reference antenna (transmission antenna) 160 is connected, through a coaxial cable 162, with a signal generator 161 configured to output the transmission power to the reference antenna (transmission antenna) 160. The signal generator 161 is connected to a measurement control unit 190 configured to control the signal generator 161, and the measurement control unit 190 is connected to the power measuring unit 150 to analyze the power measured by the power measuring unit 150. Also, in order to control the moving operation of first and second moving mechanisms 180, 181 configured to move the receiving antenna 15 and the DUT 1 or the reference antenna (transmission antenna) 160 along the axis connecting the first and second focal points F1, F2, the measurement control unit 190 is connected to the first and second moving mechanisms 180, 181.

This measurement control unit 190 has a comparison operator 202 and a memory 204. The radiated power measured at the time of execution of the various measurement methods described above is stored in the internal region of the memory 204, and the measurement data is analyzed by the comparison operator 202. More specifically, the comparison operator 202 executes the analysis process shown in FIGS. 5, 6, 13 and 15. In the comparison operator 202, for example, the measured radiated power is compared with other measured radiated power stored in the memory while at the same time storing the comparison result in the memory. Also, the comparison operator 202 calculates the total radiated power from the power measurement value and stores the calculation result in the memory. Further, the spectrum mask is stored in other regions of the memory 204.

The measurement control unit 190 is connected to an input unit 206 through an interface (not shown), and various parameters are input from the input unit 206, while an operation command is issued through the input unit 206. Also, the measurement control unit 190 is connected with a display/output unit 208, which displays both the spectrum mask as shown in FIG. 23 under the control of the measurement control unit 190 on the one hand and the measurement result determined by the comparison operator 202 on the other hand.

The coupler 21 has a metal wall surface 11 surrounding an ellipsoidal enclosed space 12. The coupler 21 is formed in a size determined based on the lower-limit frequency of the DUT, in such a manner that the ellipsoidal enclosed space 12 has the long axis of at least four wavelengths of the lower-limit frequency of the DUT. The lower-limit frequency is desirably a measurement of the frequency of not less than 300 MHz or, for practical purposes, in the measurement range of 800 MHz to 2 GHz. On the internal axis of the enclosed space 12 of the coupler 21, the DUT 1 or the reference antenna 160 is supported removably by a support unit 50 adapted to move in operatively interlocked relation with the first moving mechanism 180. By this first moving mechanism 180, the radiation center of the DUT 1 or the substantial radiation center of the reference antenna 160 is located at the position of the first focal point F1. Similarly, on the internal axis of the enclosed space 12 of the coupler 21, the receiving antenna 15 is removably supported by a removable support unit 55 adapted to move in operatively interlocked relation with the second moving mechanism 181. By this second moving mechanism 181, the radiation center of the receiving antenna 15 is located at the position of the second focal point F2.

As shown in FIGS. 23 and 24, the coupler 21 has a structure openable from upper and lower cases 22, 23 so that the DUT 1, the reference antenna 160 and the receiving antenna 15 can be taken into and out of the enclosed space 12 in the coupler 21. Specifically, the coupler 21 is openably formed in a way separable into the lower case 22 and the upper case 23. An upper plate 22a of the lower case 22 is formed with an elliptic opening (not shown), which has mounted thereon a first inner wall member 25 having an inner wall 25a with an outer periphery in the shape corresponding to the lower half portion of the ellipsoidal enclosed space 12. The inner wall member 25 is formed by pressing a metal plate or a metal mesh plate reflecting the radio wave or a metal film attached on the inner wall of a synthetic resin mold. A flange 26 slightly extended outward and overlapped with the outer edge of the opening is extended over the upper edge of the inner wall member 25, which has a flange portion 26 fixed on the upper plate 22a of the lower case 22.

A lower plate 23a of the upper case 23 also has an elliptic opening (not shown), on which a second inner wall member 30 is mounted. The second inner wall member 30 has a shape symmetric with respect to the first inner wall member 25, and includes an inner wall 30a having an outer periphery in the shape corresponding to the upper half portion of the ellipsoidal enclosed space 12. A flange 31 extended slightly outward and overlapped with the outer edge of the opening of the upper case 23 is extended over the edge portion of the inner wall 30a nearer to the opening. The flange portion 31 is fixed on the lower plate 23a. The second inner wall member 30 is also formed by pressing a metal plate or a metal mesh plate reflecting the radio wave or attaching a metal film on the inner wall of a synthetic resin mold.

The upper case 23 is openably coupled to the lower case 22 by a hinge mechanism and a lock mechanism not shown. In the case where the upper case 22 is closed and locked in overlapped relation with the lower case 23, as shown in FIG. 24, the flange 26 of the first inner wall member 25 and the flange 31 of the second inner wall member 30 come into close surface contact with each other entirely. In this way, the inner walls 25a, 30a are coupled continuously to each other and form the ellipsoidal enclosed space 12 defined by the wall surface 11.

Incidentally, the lower case 22 and the upper case 23 are formed with a positioning mechanism (having, for example, a guide pin 40 and a guide hole 41 for receiving the guide pin 40 as shown) whereby the upper and lower inner wall members 25, 30 are overlapped with each other without any displacement when the lower case 22 and the upper case 23 are closed.

Preferably, as shown in FIG. 25A, an elastic rib 45 is protruded over substantially the entire periphery of the inner edge of the inner wall member 30 on the opening side. As shown in FIG. 25B, in the case where the inner wall member 30 is overlapped with the inner wall member 25, the elastic rib 45 comes into contact with the entire periphery of the inner edge of the inner wall member 25 on the opening side and covers the contact portion between the flanges 26, 31 of the inner wall members 25, 30. In the case where a gap is formed in the contact portion, therefore, the leakage of the radio wave or the like can be reduced.

The structure shown in FIGS. 23 and 24 represents a case in which the upper plate 22a of the lower case 22 and the first inner wall member 25 are formed independently of each other, and so are the lower plate 23a of the upper case 23 and the second inner wall member 30. As an alternative, the upper plate 22a of the lower case 22 and the first inner wall member 25 may be formed of the same material, and so may be the lower plate 23a of the upper case 23, the second inner wall member 30 and the upper plate 22. The first inner wall member 25 and the second inner wall member 30, though formed to have a semi-elliptic outer periphery, may alternatively be formed in such a manner that the inner walls 25a, 30a have the inner surface along the ellipsoid as described above. In this way, the first inner wall member 25 and the second inner wall member 30 may be arbitrarily formed in any outer appearance.

As shown in FIGS. 23, 24, 26A and 26B, a radiator support unit 50 to support the DUT 1 and the reference antenna 160 in the enclosed space 12 is arranged at the position in the neighborhood of the first focal point F1 on the opening of the first inner wall member 25. Similarly, a receiving antenna support unit 55 to support the receiving antenna 15 is arranged at the position in the neighborhood of the second focal point F2 on the opening of the first inner wall member 25.

The radiator support unit 50 replaceably supports the DUT 1 or the reference antenna 160 to permit the radiation center of the DUT 1 or the reference antenna 160 to move from the reference position substantially coinciding with the focal point F1 along the axis connecting the first and second focal points F1, F2. The radiator support unit 50 is configured of a movable support plate 51 adapted to move along the axis connecting the first and second focal points F1, F2, a fixing means 52 configured to fix the radiator on the movable support plate 51 and a base 53 configured to prevent the downward movement of the movable support plate 51. Incidentally, each of these component members is formed of a synthetic resin material having a high radio wave transmittance (relative dielectric constant about unity).

The fixing means 52 is, for example, an extendible band having no effect on the radio wave propagation, and fixes the DUT 1 or the reference antenna 160 at a predetermined position on the movable support plate 51. Incidentally, at the outer end portion of the movable support plate 51, an axial portion 51a adapted to slide through the inner wall member 25 is protruded and coupled to a first moving unit 180 arranged outside the inner wall member 25.

The first moving unit 180 is configured of, for example, a stepping motor or a gear mechanism, and can move the movable support plate 51 over a designated distance by transmitting the force to the axial portion 51a in the direction along an axis of the ellipse.

Incidentally, in the case where the reference antenna 160 is supported, a hole is formed through the interior of the axial portion 51a of the movable support plate 51, for example, by way of which the coaxial cable 16 for supplying the signal can be pulled out.

Also, the receiving antenna support unit 55, like the radiator support unit 51, is formed of a synthetic resin material having a high transmittance of the radio wave, and includes a movable support plate 56, a base 57 configured to prevent the downward movement of the movable support plate 56 and a fixing means 58 configured to fix the receiving antenna 15 on the movable support plate 56.

Generally, the receiving antenna 15 is formed by printing an antenna element 15b on a base 15a by etching, and the fixing means 58 to fix the receiving antenna 15 is configured of a screw or a clip of, for example, a synthetic resin material which does not change the characteristic of the receiving antenna 15. In this way, the radiation center of the antenna element of the receiving antenna 15 is fixed at a position on an axis of the ellipse connecting the first and second focal points F1, F2 on the movable support plate 56.

The movable support plate 56 configured to support the receiving antenna 15 also has, at the outer end portion thereof, a protruded axial portion 56a adapted to slide through the inner wall member 25. An axial portion 56a of the movable support plate 56 is coupled to a second moving unit 181 arranged outside the inner wall member 25.

The second moving unit 181 has a similar structure to the first moving unit 180, and moves the movable support plate 56 by transmitting the force in the direction along an axis of the ellipse to the axial portion 56a coupled thereto.

Incidentally, in order to make it possible to pull out the coaxial cable 16 of the receiving antenna 15, a hole is formed through, for example, the inside of the axial portion 56a of the movable support plate 56. Also, as shown in FIG. 26B, the receiving antenna 15, if it is of the balanced type such as the dipole antenna or the loop antenna, is connected to the coaxial cable 16 of unbalanced type through a balun 15c inserted at the power feeding point.

Although both the radiator (the DUT 1 or the reference antenna 160) and the receiving antenna 15 are movable in the aforementioned case, an alternative configuration may be employed in which one of them is kept fixed at a position in the neighborhood of one focal point while the other can be moved by the corresponding moving unit.

The first and second moving units 180, 181 are controlled by a measurement control unit 90 to move in the directions away from each other from the first and second focal points F1, F2 in the case where the reference positions or, for example, the first and second focal points F1, F2 coincide with the antenna-mounting reference positions of the movable support plates 51, 56, respectively.

Ideally, the receiving antenna 15 has the same gain in all directions. In the absence of such an antenna, the antenna actually used is either a dipole antenna having the element 15b sufficiently short as compared with the wavelength with a comparatively broad directivity as shown in FIG. 26B, a bow-tie antenna having a larger element width for broadband application or the like. Also, the sleeve antenna or the like may be used as the dipole antenna. The sleeve antenna extended in the direction along the Z axis has a null component in the Z axis direction, and therefore, is more desirably extended along the Z axis in the coupler.

The dipole antenna has a very small gain along the length of the element 15b. Utilizing this directivity, therefore, the length of the element 15b is rendered to coincide with the direction toward the radiation center of the DUT 1 (toward the focal point F1) as shown in FIG. 26A. In this way, the effect of the direct wave from the DUT 1 to the receiving antenna 15 can be reduced. Also, in the case of the dipole antenna, the direction along the length of the element thereof is the main polarization direction, and the gain of the cross-polarized wave component orthogonal thereto is very small (what is called the single linear polarization).

Also, in the antenna of the UWB terminal or the RFID tag of the DUT is designed for linear polarization, and substantially the entire radiated power is the single linear polarization component with a very small cross polarized component. In the case where the radiated power of the DUT 1 is the single linear polarization wave with a negligible cross-polarized component, therefore, the orientation of the DUT 1 is determined and fixed in such a manner that the direction of polarization thereof coincides with the main polarization direction of the receiving antenna 15.

In the case where the radiated power of the DUT 1 to be measured is not the single polarization wave, i.e. in the case where the radio wave having the power of the cross-polarized component not negligible as compared with the main polarization component, on the other hand, the first step is to determine the orientation of the DUT 1 in such a manner that the main polarization direction of the DUT 1 coincides with that of the receiving antenna 15, and then the maximum power is measured using the moving method described above. Next, the orientation of the DUT 1 is determined in such a manner that the direction of the crossing polarization of the DUT 1 coincides with the direction of the main polarization of the receiving antenna 15, followed by measuring the maximum power using the moving method described above.

Similarly, the measurement is taken also for the reference antenna using the two methods described above. The output level of a signal generator 70 is checked to make sure that the power of each polarization direction is equal, and by the arithmetic operation described above, the radiated power in each polarization direction of the DUT 1 is determined and totalized to determine the total radiated power.

Incidentally, in the case where the loop antenna or the orthogonal 2-element dipole antenna, not shown, capable of receiving the orthogonal polarization components at the same time is used as the receiving antenna 15, then the total radiated power of the DUT 1 can be determined in one measuring operation. Also, the posture of the DUT 1 or the orientation of the receiving antenna 15 is changed, and by thus determining the radiated power of each polarization component and totalizing the power determined thus obtained, the total radiated power can be determined. In such a case, a mechanism capable of rotating the receiving antenna 15 is conveniently added to the moving unit 181 to change the direction of polarization as described above.

The signal S received by the receiving antenna 15 is output externally of the coupler 21 through the coaxial cables 16.

Incidentally, the coaxial cables 16 moves with the movement of the movable support plate 56 supporting the receiving antenna 15. By using a flexible cable as at least the part of the coaxial cables 16 outside the coupler 21, the coaxial cables 16 can be connected to the power measuring unit 150 without hampering the movement of the movable support plate 56. This is also the case with a coaxial cables 162 connected to the reference antenna 16.

As the power measuring unit 150, a broadband wattmeter, a spectrum analyzer, a receiver having frequency selectivity or the like can be used. As described above, LNA may also be used at the same time.

In accordance with the measurement method described above, the measurement control unit 190 controls the moving units 180, 181 and the signal level of the signal generator 161, while at the same time executing the arithmetic operation on the output of the power measurement unit 150 thereby to calculate the TRP of the DUT 1.

First, the coupler 21 is opened, and the DUT 1 is supported at the reference position of the radiator support unit 51. Then, with the coupler 21 closed, the DUT 1 and the receiving antenna 15 are moved symmetrically with respect to each other about the center of the corresponding one of the focal points F1, F2, respectively, in the neighborhood thereof. Then, a first measurement value P1 maximizing the output signal power of the receiving antenna 15 is stored.

Next, the coupler 21 is opened, and in place of the DUT 1, the reference antenna 160 is installed. Through the coaxial cable 162, the reference antenna 160 is connected to the signal generator 161, and the coupler 21 is closed. Under this condition, a signal of the same frequency (or the same central frequency) as that of the radio wave output by the DUT 1 is output from the signal generator 161, and the reference antenna 160 and the receiving antenna 15 are moved symmetrically along the axis of the ellipse in the same way as described above. Then, the position maximizing the output signal power of the receiving antenna 15 is determined, and the output level of the signal generator 161 is variably controlled in such a manner that the associated power value is equal to the first measurement value P1. This signal output value is stored as a second measurement value P2.

Based on the first measurement value P1, the second measurement value P2, the known reflection coefficient Γ of the reference antenna 160 and the loss Lc of the cable, etc., the total radiated power of the DUT 1 is calculated in accordance with Equation (3) above.

As described above, however, the total radiated power TRPz obtained by this measurement is the total power of the polarization component along the Z axis. In the case where the DUT 1 has only the Z-axis polarized component like the dipole antenna, this total radiated power TRPz is the actual total radiated power. In the case where the DUT 1 radiates other polarized components, however, the aforementioned measurement is carried out for the X-axis polarized component and Y-polarized component, and the total sum described below is determined.

$$TRP=TRPz+TRPx+TRPy$$

Incidentally, apart from the measurement method with a fixed frequency explained above as the operation of the radiated power measurement apparatus, the measurement method described below is also available.

Specifically, with the DUT 1 and the receiving antenna 15 set at arbitrary discrete points within a predetermined movable range, the frequency of the receiving signal is swept within a predetermined range, and for each frequency thereof, the receiving signal level is retrieved. This process is executed at all discrete points by moving the positions of the DUT 1 and the receiving antenna 15, and the frequency spectrum data is determined for each position. From this data, the maximum receiving power for each measurement frequency is determined.

Then, using the reference antenna 160 in place of the DUT 1, the same measurement as described above is conducted, and by performing the arithmetic operation described above for each frequency the radiated power for each frequency can be determined.

Incidentally, the structure of the coupler 21 described above is only an example according to an embodiment. Considering the direction in which the wall surface forming the ellipsoidal space is divided, in the case where the length direction of the dipole antenna element is rendered to coincide with the long axis of the ellipse as described above, the current flows along the wall surface in the direction along the meridian containing the long axis of the ellipse.

In the case where the inner wall members 25, 30 are formed to divide the enclosed space of the ellipsoid by a surface along the long axis thereof as described above, therefore, the direction of the gap generated by the division is parallel to the direction in which the current flows, and, the current is not cut off. As a result, the leakage of the radio wave from the particular gap can be suppressed.

On the other hand, considering a case in which the DUT 1 of such a characteristic that the current flows along the wall surface in a quite different direction is measured using a shared coupler 21, it is difficult to prevent the leakage of the radio wave from the gap of the dividing surface of the case. As described above, therefore, the contact portion (dividing surface) of the flanges 26, 31 is covered by the elastic rib 45 and the two inner wall members 25, 30 are preferably overlapped to prevent the leakage of the radio wave.

According to the various embodiments, there are provided a radiated power measurement method, a radiated power measurement coupler and a radiated power measurement apparatus capable of measuring the total radiated power accurately free of the effect of the size or directivity of the DUT.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A radiated power measurement method comprising the steps of arranging a device under test capable of radiating a radio wave in an enclosed space having first and second focal points, in such a manner that the radiation center of the radio wave of the device under test substantially coincides with the neighborhood of the first focal point, wherein the enclosed space is defined by a metal wall surface of an ellipsoid obtained by rotating an ellipse around an axis passing through the first focal point and the second focal point; and reflecting the radio wave radiated from the device under test, on the wall surface, and receiving the radio wave by a receiving antenna arranged in the neighborhood the second focal point thereby to measure, at the measuring end of the receiving antenna, the total radiated power of the device under test from the output signal of the receiving antenna, wherein at least one of the device under test and the receiving antenna is moved along the axis passing through the first and second focal points, and based on the measurement value maximizing the output signal power of the receiving antenna, calculating the total radiated power of the device under test.

2. The radiated power measurement method according to claim 1, further comprising the steps of:

moving at least one of the device under test and the receiving antenna along the axis passing through the first and second focal points, and by maximizing the output signal power of the receiving antenna, storing the maximum output signal power as a first measurement value;

moving at least one of a reference antenna installed in place of the device under test to receive a signal and radiate the radio wave and the receiving antenna, along the axis passing through the first and second focal points, maximizing the output signal power of the receiving antenna, and determining, as a second measurement value, the signal power input to the reference antenna in the case where the maximum value is equal to the first measurement value; and calculating the total radiated power of the device under test based on the first measurement value, the second measurement value, and the reflection coefficient and the loss of the reference antenna.

3. The radiated power measurement method according to claim 1, further comprising the steps of:
moving at least one of the device under test and the receiving antenna along the axis passing through the first and second focal points, and by maximizing the output signal power of the receiving antenna, storing the maximum output signal power of the receiving antenna as a first measurement value;
moving at least one of a reference antenna installed in place of the device under test to receive a signal and radiate the radio wave and the receiving antenna, along the axis passing through the first and second focal points, changing the signal power supplied to the reference antenna with the output signal power of the receiving antenna maximized;
determining the calibration data indicating the relation between the signal power and the corresponding output signal power of the receiving antenna; and
calculating the total radiated power of the device under test based on the first measurement value, the calibration data and the reflection coefficient and the loss of the reference antenna.

4. The radiated power measurement method according to claim 1, further comprising the steps of:
moving at least one of the device under test and the receiving antenna along the axis passing through the first and second focal points, and by determining the power for each frequency in a predetermined frequency range to be measured with respect to the output signal of the receiving antenna for each position of the antenna, storing the maximum power for each frequency as a third measurement value;
moving at least one of a reference antenna installed in place of the device under test and supplied with a signal to radiate the radio wave and the receiving antenna, along the axis passing through the first and second focal points, and by determining the power for each frequency to be measured with respect to the output signal of the receiving antenna for each position of the one antenna, storing the data including the maximum power for each frequency as a fourth measurement value; and
calculating the total radiated power in the predetermined frequency range of the device under test to be measured, based on the third measurement value, the fourth measurement value and the reflection coefficient and the loss of the reference antenna.

5. The radiated power measurement method according to claim 4, wherein in the case where the reference antenna is used in place of the device under test, the calibration data indicating the relation between the signal power supplied to the reference antenna and the power of the corresponding output signal of the receiving antenna is determined as the fourth measurement value.

6. The radiated power measurement method according to claim 1, wherein selected one of the device under test and the reference antenna is moved together with the receiving antenna symmetrically with respect to each other about the center of the first and second focal points.

7. The radiated power measurement method according to claim 4, further comprising the steps of:
storing a spectrum mask of a predetermined standard including a frequency and an output strength; and
determining whether the standard is satisfied or not, by comparing the spectrum mask with the value of the total radiated power of the radio wave for each frequency within a predetermined frequency range to be measured.

8. The radiated power measurement method according to claim 4, further comprising the steps of: adjusting the position of at least one of the device under test and the receiving antenna along at least one of X, Y and Z axes;
storing the third measurement value each time the position of at least one of the device under test and the receiving antenna is adjusted along at least one of the X, Y and Z axes;
adjusting the position of at least one of a reference antenna installed in place of the device under test and supplied with a signal to radiate the radio wave and the receiving antenna, along at least one of the X, Y and Z axes;
storing the fourth measurement value each time the position of at least one of the reference antenna and the receiving antenna is adjusted along at least one of the X, Y and Z axes; and
calculating the total radiated power of the device under test in the predetermined frequency range to be measured, based on the third measurement value, the fourth measurement value and the reflection coefficient and the loss of the reference antenna.

9. A radiated power measurement coupler configured to measure a radiated power, and comprising a radiator which radiates a radio wave and a receiving antenna which receives the radio wave radiated from the radiator, wherein the radiator includes one of a device under test and a reference antenna, the radiator and the receiving antenna are supported in an enclosed space defined by a metal wall surface, the receiving antenna receives the radio wave radiated from the radiator to output the receiving signal, and the coupler further comprises:
a radiator support unit with the enclosed space formed as an ellipsoid obtained by rotating an ellipse around an axis passing through first and second focal points and the radiator supported in such a manner that the radiation center of the radio wave of the radiator is located in the neighborhood of the first focal point of the ellipse;
a receiving antenna support unit which supports the receiving antenna with the central position thereof located in the neighborhood of the second focal point of the ellipse; and
a moving unit which moves at least selected one of the radiator and the receiving antenna along the axis passing through the first and second focal points,
wherein the radio wave radiated from the radiator is reflected on the wall surface and received by the receiving antenna while at the same time changing the relative positions of the radiator and the receiving antenna by the moving unit thereby to maximize the output signal power of the receiving antenna.

10. A radiated power measurement apparatus comprising:
the radiated power measurement coupler according to claim 9;
a power measurement unit which determines the power of the output signal of the receiving antenna of the radiated power measurement coupler;
a signal supply unit which supplies a signal from outside the radiated power measurement coupler to the reference antenna supported on the radiator support unit; and
a measurement control unit which drives the moving unit with the device under test supported on the radiator support unit and detects the maximum value of the power of the output signal of the receiving antenna as a first measurement value thereby to calculate the total radiation power of the device under test based on the first measurement value.

11. The radiated power measurement apparatus according to claim 10, wherein:
in detecting the maximum value of the power of the output signal of the receiving antenna as the first measurement value, the reference antenna is installed in place of the device under test, the moving unit is driven with the signal supplied to the reference antenna from the signal supply unit to set the power of the output signal of the receiving antenna to be maximized, the output signal of the signal supply unit is variably controlled so that the maximum value of the power at the installation position is equal to the first measurement value thereby to determine the output signal power obtained by the control operation as a second measurement value, the total radiated power of the device under test being calculated based on the first measurement value, the second measurement value and the reflection coefficient and the loss of the reference antenna.

12. The radiated power measurement apparatus according to claim 10, wherein:
in detecting the maximum value of the power of the output signal of the receiving antenna as the first measurement value, the reference antenna is installed in place of the device under test, the moving unit is driven with the signal supplied to the reference antenna from the signal supply unit to set the power of the output signal of the receiving antenna to be maximized, the signal power supplied to the reference antenna being changed thereby to determine calibration data indicating the relation between the signal power and the output signal of the receiving antenna, the total radiated power of the device under test being calculated based on the first measurement value, the calibration data and the reflection coefficient and the loss of the reference antenna.

13. The radiated power measurement apparatus, comprising:
the radiated power measurement coupler according to claim 9;
a power measurement unit which determines the power of the output signal of the receiving antenna of the radiated power measurement coupler;
a signal supply unit which supplies a signal from outside the radiated power measurement coupler to the reference antenna supported on the radiator support unit; and
a measurement control unit which drives the moving unit with the device under test supported on the radiator support unit and determines the power for each frequency in a predetermined frequency range to be measured, with respect to the output signal of the receiving antenna at each antenna position thereby to detect the maximum value for each frequency as a third measurement value, at least one of a reference antenna and the receiving antenna being moved along the axis passing through the first and second focal points, the reference antenna being installed in place of the device under test and supplied with a signal to radiate the radio wave, the power being determined for each frequency to be measured with respect to the output signal of the receiving antenna at each antenna position thereby to detect the data including the maximum power for each frequency as a fourth measurement value, the total radiated power of the device under test being calculated in the predetermined frequency range based on the third measurement value, the fourth measurement value and the reflection coefficient and the loss of the reference antenna.

14. The radiated power measurement apparatus according to claim 13, wherein in the case where the reference antenna is used in place of the device under test, the measurement control unit determines, as the fourth measurement value, the calibration data indicating the relation between the signal power supplied to the reference antenna and the power of the corresponding output signal of the receiving antenna.

15. The radiated power measurement apparatus according to claim 10, wherein the measurement control unit moves selected one of the device under test and the reference antenna together with the receiving antenna symmetrically with each other about centers of the first and second focal points.

16. The radiated power measurement apparatus according to claim 13, comprising:
a memory which stores a spectrum mask of a predetermined standard having a frequency and an output strength; and
a determining unit which compares the spectrum mask with the value of the total radiated power of the radio wave for each frequency in a predetermined frequency range to be measured, and determines whether the standard is satisfied or not.

17. The radiated power measurement apparatus according to claim 13, comprising:
a first adjusting mechanism which adjusts the position of at least one of the device under test and the receiving antenna along at least one of the X, Y and Z axes;
a storage unit which stores the third measurement value each time the position of at least one of the device under test and the receiving antenna is adjusted along at least one of the X, Y and Z axes;
a second adjusting mechanism which adjusts the position of at least one of the reference antenna and the receiving antenna along at least one of the X, Y and Z axes, the reference antenna being installed in place of the device under test and supplied with a signal to radiate the radio wave;
a storage unit which stores the fourth measurement value each time the position of at least one of the reference antenna and the receiving antenna is adjusted along at least one of the X, Y and Z axes; and
a processing unit which calculates the total radiated power in the predetermined frequency range of the device under test to be measured, based on the third measurement value, the fourth measurement value and the reflection coefficient and the loss of the reference antenna.

* * * * *